(12) United States Patent
Nozoe et al.

(10) Patent No.: US 12,360,302 B2
(45) Date of Patent: Jul. 15, 2025

(54) OPTICAL LAMINATE, POLARIZING PLATE, AND IMAGE DISPLAY DEVICE

(71) Applicant: FUJIFILM Corporation, Tokyo (JP)

(72) Inventors: Yutaka Nozoe, Kanagawa (JP); Kunihiro Kasezawa, Kanagawa (JP); Koji Iijima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 512 days.

(21) Appl. No.: 17/890,253

(22) Filed: Aug. 17, 2022

(65) Prior Publication Data

US 2022/0404535 A1 Dec. 22, 2022

Related U.S. Application Data

(63) Continuation of application No. PCT/JP2021/006404, filed on Feb. 19, 2021.

(30) Foreign Application Priority Data

Feb. 20, 2020 (JP) .................................. 2020-026984

(51) Int. Cl.
*G02B 5/30* (2006.01)
*H10K 59/80* (2023.01)

(52) U.S. Cl.
CPC ........ *G02B 5/3016* (2013.01); *C09K 2323/02* (2020.08); *C09K 2323/031* (2020.08); *H10K 59/8791* (2023.02)

(58) Field of Classification Search
None
See application file for complete search history.

(56) References Cited

U.S. PATENT DOCUMENTS

| | | | | |
|---|---|---|---|---|
| 11,860,338 | B2* | 1/2024 | Maruyama | G02F 1/133711 |
| 2007/0042189 | A1* | 2/2007 | Shirai | C09K 19/2007 |
| | | | | 428/411.1 |

(Continued)

FOREIGN PATENT DOCUMENTS

| | | |
|---|---|---|
| JP | 2006215221 | 8/2006 |
| JP | 2016085424 | 5/2016 |

(Continued)

OTHER PUBLICATIONS

"International Search Report (Form PCT/ISA/210) of PCT/JP2021/006404," mailed on Apr. 20, 2021, with English translation thereof, pp. 1-5.

(Continued)

*Primary Examiner* — Derek S. Chapel
(74) *Attorney, Agent, or Firm* — JCIPRNET

(57) ABSTRACT

According to the present invention, provided are an optical laminate which has excellent adhesiveness between two optically anisotropic layers, and in which an A plate or a layer obtained by fixing a twist-aligned liquid crystal phase, which is as an optically anisotropic layer, has excellent liquid crystal alignment properties, a polarizing plate, and an image display device. An optical laminate of the present invention has: a first optically anisotropic layer formed of a first liquid crystal compound; a second optically anisotropic layer formed of a second liquid crystal compound; and a mixed layer which is disposed between the first optically anisotropic layer and the second optically anisotropic layer and contains a component derived from the first liquid crystal compound and a component derived from the second liquid crystal compound, the first optically anisotropic layer is a C plate, the second optically anisotropic layer is an A plate or a layer obtained by fixing a twist-aligned liquid crystal phase, the mixed layer further contains a photo-alignment compound, and in an analysis of components of (Continued)

the optical laminate in a depth direction by time-of-flight secondary ion mass spectrometry with ion beam irradiation from a surface of the optical laminate on a first optically anisotropic layer side toward a second optically anisotropic layer side, predetermined requirements are satisfied.

9 Claims, 1 Drawing Sheet

(56) References Cited

U.S. PATENT DOCUMENTS

| | | |
|---|---|---|
| 2019/0162889 A1 | 5/2019 | Delbaere et al. |
| 2022/0035086 A1 | 2/2022 | Delbaere et al. |
| 2022/0066080 A1* | 3/2022 | Sato ................. G02B 5/283 |
| 2023/0305209 A1* | 9/2023 | Nakamura ............ G02B 5/30 |

FOREIGN PATENT DOCUMENTS

| | | |
|---|---|---|
| JP | 2019015981 | 1/2019 |
| JP | 2019139219 | 8/2019 |
| JP | 2019522245 | 8/2019 |
| WO | 2014156981 | 10/2014 |

OTHER PUBLICATIONS

"Written Opinion of the International Searching Authority (Form PCT/ISA/237)" of PCT/JP2021/006404, mailed on Apr. 20, 2021, with English translation thereof, pp. 1-8.

"Notice of Reasons for Refusal of Japan Counterpart Application", issued on Oct. 3, 2023, with English translation thereof, p. 1-p. 6.

* cited by examiner

OPTICAL LAMINATE, POLARIZING PLATE, AND IMAGE DISPLAY DEVICE

CROSS-REFERENCE TO RELATED APPLICATIONS

This application is a Continuation of PCT International Application No. PCT/JP2021/006404 filed on Feb. 19, 2021, which claims priority under 35 U.S.C. § 119(a) to Japanese Patent Application No. 2020-026984 filed on Feb. 20, 2020. Each of the above application(s) is hereby expressly incorporated by reference, in its entirety, into the present application.

BACKGROUND OF THE INVENTION

1. Field of the Invention

The present invention relates to an optical laminate, a polarizing plate, and an image display device.

2. Description of the Related Art

Optically anisotropic layers are used in various image display devices from the viewpoints of solving image staining or enlarging a view angle.

As the optically anisotropic layers, layers formed of a liquid crystal compound have been proposed.

A plurality of optically anisotropic layers may be laminated and used.

For example, JP2019-139219A discloses a laminate including a vertically aligned liquid crystal cured film, a horizontal alignment film, and a horizontal aligned liquid crystal cured film in this order. In the above laminate, a horizontal alignment film is disposed between the two optically anisotropic layers.

SUMMARY OF THE INVENTION

In recent years, a laminate including a plurality of optically anisotropic layers is required to have improved adhesiveness between the optically anisotropic layers.

The inventors conducted evaluation regarding the adhesiveness between the two optically anisotropic layers in the laminate described in JP2019-139219A, and found that it is required to further improve the adhesiveness.

In improving the adhesiveness, it is also required that a liquid crystal compound in the optically anisotropic layer has good aligning properties. In particular, it is also required that a liquid crystal compound constituting an A plate or a layer obtained by fixing a twist-aligned liquid crystal phase has good aligning properties. Hereinafter, excellent alignment of the liquid crystal compound in each layer is also referred to as excellent liquid crystal alignment properties.

The present invention is contrived in view of the above circumstances, and an object thereof is to provide an optical laminate which has excellent adhesiveness between two optically anisotropic layers, and in which an A plate or a layer obtained by fixing a twist-aligned liquid crystal phase, which is as an optically anisotropic layer, has excellent liquid crystal alignment properties.

Another object of the present invention is to provide a polarizing plate and an image display device.

The inventors have conducted intensive studies to achieve the above objects, and completed the present invention having the following configuration.

(1) An optical laminate having: a first optically anisotropic layer formed of a first liquid crystal compound;
a second optically anisotropic layer formed of a second liquid crystal compound; and
a mixed layer which is disposed between the first optically anisotropic layer and the second optically anisotropic layer and contains a component derived from the first liquid crystal compound and a component derived from the second liquid crystal compound,
in which the first optically anisotropic layer is a C plate,
the second optically anisotropic layer is an A plate or a layer obtained by fixing a twist-aligned liquid crystal phase,
the mixed layer further contains a photo-alignment compound, and
in an analysis of components of the optical laminate in a depth direction by time-of-flight secondary ion mass spectrometry with ion beam irradiation from a surface of the optical laminate on a first optically anisotropic layer side toward a second optically anisotropic layer side, both conditions 1 and 2 to be described later are satisfied.

(2) The optical laminate according to (1), in which in a case where an intermediate position between the first position and the second position is set as a third position, and
a depth position closer to the second position than the third position, which is between the first position and the second position, is set as a specific depth position,
secondary ions derived from the first liquid crystal compound and the second liquid crystal compound are detected at any depth position in a region between the first position and the specific depth position.

(3) The optical laminate according to (1) or (2), in which the mixed layer has a thickness of 1 to 1,000 nm.

(4) The optical laminate according to any one of (1) to (3), in which the mixed layer has a thickness of 10 to 500 nm.

(5) The optical laminate according to any one of (1) to (4), in which the photo-alignment compound in the mixed layer has a horizontal alignment function.

(6) The optical laminate according to any one of (1) to (5), in which the first liquid crystal compound and the second liquid crystal compound are liquid crystal compounds having a polymerizable group.

(7) A polarizing plate having: the optical laminate according to any one of (1) to (6); and a polarizer.

(8) An image display device having: the optical laminate according to any one of (1) to (6); or the polarizing plate according to (7).

According to the present invention, it is possible to provide an optical laminate which has excellent adhesiveness between two optically anisotropic layers, and in which an A plate or a layer obtained by fixing a twist-aligned liquid crystal phase, which is an optically anisotropic layer, has excellent liquid crystal alignment properties.

In addition, according to the present invention, it is possible to provide an image display device.

DESCRIPTION OF THE PREFERRED EMBODIMENTS

Figure 1:
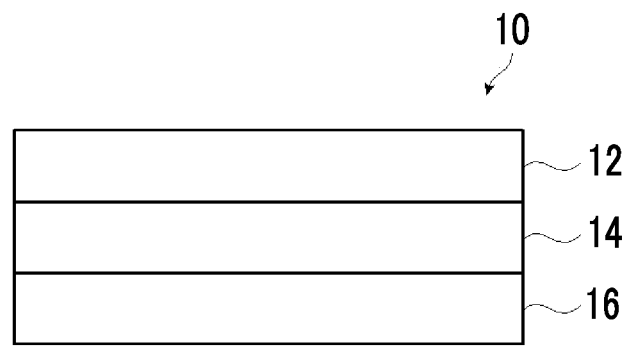
FIG. 1 is a schematic diagram showing an example of an optical laminate.

Hereinafter, the present invention will be described in detail.

The following description of configuration requirements is based on representative embodiments of the present invention, but the present invention is not limited to the embodiments.

In this specification, a numerical range expressed using "to" means a range including numerical values before and after "to" as a lower limit and an upper limit.

In the present invention, Re ($\lambda$) and Rth ($\lambda$) represent an in-plane retardation and a thickness-direction retardation at a wavelength $\lambda$, respectively. Unless otherwise specified, the wavelength $\lambda$ is 550 nm.

In the present invention, Re ($\lambda$) and Rth ($\lambda$) are values measured at a wavelength $\lambda$ by AxoScan, manufactured by Axometrics, Inc. By inputting an average refractive index ((nx+ny+nz)/3) and a film thickness (d ($\mu$m)) by AxoScan, Slow Axis Direction (°)

$$Re(\lambda)=R0(\lambda)$$

$$Rth(\lambda)=((nx+ny)/2-nz)\times d$$

are calculated.

R0 ($\lambda$) is displayed as a numerical value calculated by AxoScan, and means Re ($\lambda$).

In this specification, refractive indices nx, ny, and nz are measured using an Abbe's refractometer (NAR-4T, manufactured by Atago Co., Ltd.) and a sodium lamp ($\lambda$=589 nm) as a light source. In addition, in the measurement of wavelength dependency, the wavelength dependency can be measured by a multi-wavelength Abbe refractometer DR-M2 (manufactured by ATAGO CO., LTD.) in combination with a dichroic filter.

In addition, values in Polymer Handbook (JOHN WILEY & SONS, INC) and catalogs of various optical films can be used. Examples of the average refractive indices of main optical films are as follows: cellulose acylate (1.48), cycloolefin polymer (1.52), polycarbonate (1.59), polymethylmethacrylate (1.49), and polystyrene (1.59).

In this specification, the "light" means an actinic ray or radiation, meaning, for example, a bright line spectrum of a mercury lamp, a far ultraviolet ray represented by an excimer laser, an extreme ultraviolet ray (EUV light), an X-ray, an ultraviolet ray, an electron beam (EB), and the like. Of these, an ultraviolet ray is preferable.

In addition, the bonding direction of a divalent group (for example, —O—CO—) described in this specification is not particularly limited, and for example, in a case where $L^2$ in a "$L^1$-$L^2$-$L^3$" bond is —O—CO—, and a bonding position on the $L^1$ side is represented by *1 and a bonding position on the $L^3$ side is represented by *2, $L^2$ may be *1-O—CO-*2 or *1-CO—O-*2.

In this specification, the A plate is defined as follows.

There are two types of A plates: a positive A plate; and a negative A plate, and in a case where the refractive index in a slow axis direction in the film plane (in a direction in which the refractive index in the plane is maximum) is represented by nx, the refractive index in a direction orthogonal to the in-plane slow axis in the plane is represented by ny, and the refractive index in the thickness direction is represented by nz, the positive A plate satisfies a relationship represented by Expression (A1), and the negative A plate satisfies a relationship represented by Expression (A2). The Rth of the positive A plate shows a positive value, and the Rth of the negative A plate shows a negative value.

$$nx>ny\approx nz \quad \text{Expression (A1)}$$

$$ny<nx\approx nz \quad \text{Expression (A2):}$$

The symbol "$\approx$" includes not only a case where both are exactly the same, but also a case where both are substantially the same. Regarding the expression "substantially the same", for example, "ny nz" also includes a case where (ny−nz)×d (where d is a film thickness) is −10 to 10 nm, and preferably −5 to 5 nm, and "nx nz" also includes a case where (nx−nz)×d is −10 to 10 nm, and preferably −5 to 5 nm.

There are two types of C plates: a positive C plate; and a negative C plate. The positive C plate satisfies a relationship represented by Expression (C1), and the negative C plate satisfies a relationship represented by Expression (C2). The Rth of the positive C plate shows a negative value, and the Rth of the negative C plate shows a positive value.

$$nz>nx\approx ny \quad \text{Expression (C1)}$$

$$nz<nx\approx ny \quad \text{Expression (C2)}$$

The symbol "$\approx$" includes not only a case where both are exactly the same, but also a case where both are substantially the same. Regarding the expression "substantially the same", "nx$\approx$ny" includes, for example, a case where (nx−ny)×d (where d is a film thickness) is 0 to 10 nm, and preferably 0 to 5 nm.

The layer obtained by fixing a twist-aligned liquid crystal phase means a layer obtained by fixing a phase in which a liquid crystal compound is twist-aligned along a spiral axis extending in a thickness direction. The twist angle is not particularly limited, and for example, a twist-aligned liquid crystal phase in which a twist angle is larger than 0° and equal to or smaller than 360° may be considered. A cholesteric liquid crystal phase can be exemplified as a type of twist-aligned liquid crystal phase. In this specification, the cholesteric liquid crystal phase is intended to have an aspect in which a twist angle is larger than 360°.

As features of the optical laminate according to the embodiment of the present invention, providing a mixed layer containing a photo-alignment compound and satisfying predetermined conditions 1 and 2 can be exemplified.

It has been found that in a case where the optical laminate satisfies the requirements of the conditions 1 and 2, the liquid crystal compound has excellent aligning properties, and the adhesiveness between the first optically anisotropic layer and the second optically anisotropic layer is also excellent.

Hereinafter, an embodiment of the optical laminate will be described with reference to the drawing.

FIG. 1 is a schematic diagram showing an example of an optical laminate. An optical laminate 10 has a first optically anisotropic layer 12, a mixed layer 14, and a second optically anisotropic layer 16 in this order. The mixed layer 14 is disposed between the first optically anisotropic layer 12 and the second optically anisotropic layer 16.

Both the first optically anisotropic layer 12 and the second optically anisotropic layer 16 are layers formed of a liquid crystal compound. The first optically anisotropic layer 12 is a C plate, and the second optically anisotropic layer 16 is an A plate or a layer obtained by fixing a twist-aligned liquid crystal phase.

As shown in the optical laminate 10, the first optically anisotropic layer 12 and the mixed layer 14 are in direct contact with each other, and the second optically anisotropic layer 16 and the mixed layer 14 are in direct contact with each other.

The optical laminate according to the embodiment of the present invention satisfies both the following conditions 1 and 2 in an analysis of components of the optical laminate in a depth direction by time-of-flight secondary ion mass spectrometry with ion beam irradiation from a surface of the optical laminate on the first optically anisotropic layer side toward the second optically anisotropic layer side.

Condition 1: In a case where a depth position of the mixed layer where a secondary ion intensity derived from the photo-alignment compound is maximum is set as a peak position, a depth position closer to the first optically anisotropic layer than the peak position, which exhibits a secondary ion intensity that is half of the secondary ion intensity at the peak position, is set as a first position, and a depth position closer to the second optically anisotropic layer than the peak position, which exhibits a secondary ion intensity that is half of the secondary ion intensity at the peak position, is set as a second position, secondary ions derived from a first liquid crystal compound and a second liquid crystal compound are detected at any depth position in a region between the first position and the second position.

Condition 2: In a case where a distance between the first position and the peak position is set as a first distance and a distance between the second position and the peak position is set as a second distance, the second distance is 50% or greater of a total of the first distance and the second distance.

Hereinafter, the conditions 1 and 2 will be described in detail using the drawing.

Figure 2:
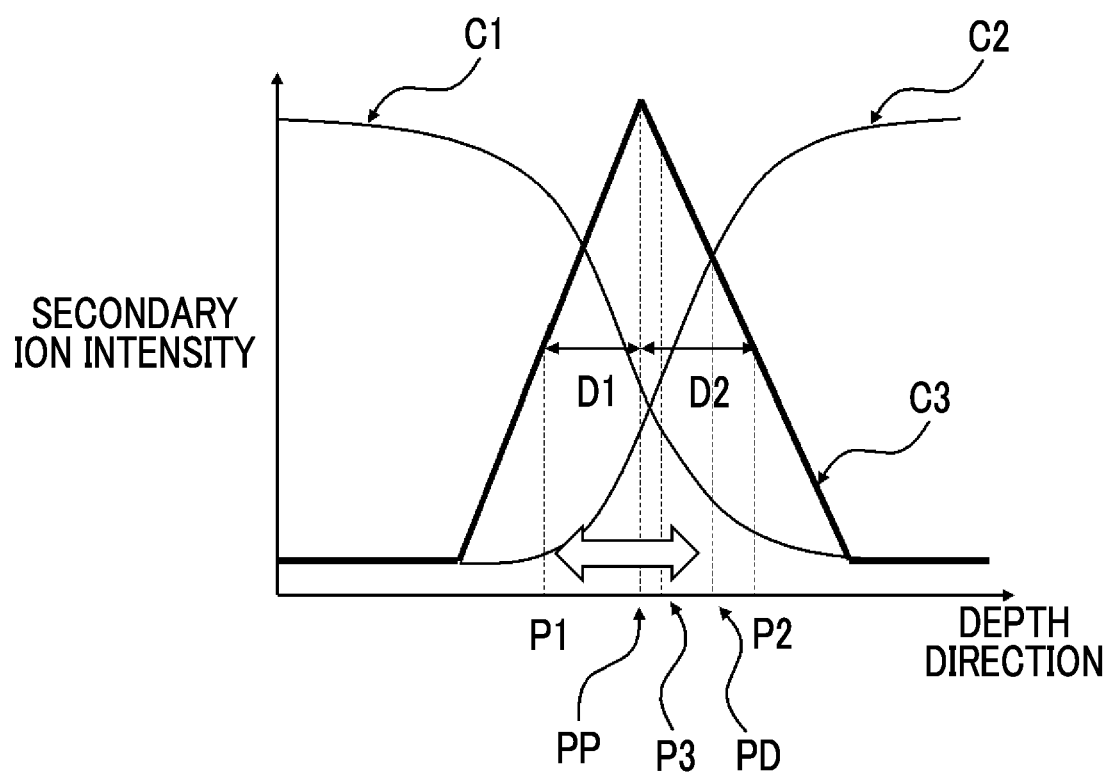
FIG. 2 is a schematic diagram for describing a profile of a photo-alignment compound in a depth direction detected by analyzing components of a mixed layer in a depth direction by time-of-flight secondary ion mass spectrometry (TOF-SIMS).

FIG. 2 shows an example of a profile obtained by analyzing components in the respective layers in a depth direction by TOF-SIMS with ion sputtering from the surface of the optical laminate 10 on the side of the first optically anisotropic layer 12 toward the side of the second optically anisotropic layer 16. In this specification, the depth direction means a direction toward the side of the second optically anisotropic layer 16 with respect to the surface of the optical laminate 10 on the side of the first optically anisotropic layer 12.

In the profile in the depth direction shown in FIG. 2, the horizontal axis (the axis extending in the right-and-left direction in FIG. 2) represents a depth based on the surface of the optical laminate 10 on the side of the first optically anisotropic layer 12, and the vertical axis (the axis extending in the up-and-down direction in FIG. 2) represents a secondary ion intensity of each component.

The TOF-SIMS method is specifically described in "Surface Analysis Technique Selection, Secondary Ion Mass Spectrometry" edited by Japanese Society of Surface Science, MARUZEN GROUP (published in 1999).

In the analysis of the components of the optical laminate in the depth direction by TOF-SIMS with ion beam irradiation, a series of operations in which component analysis is performed in a surface depth region of 1 to 2 nm, and then after digging from 1 nm to several hundreds of nanometers in the depth direction, component analysis is performed in a surface depth region of 1 to 2 nm is repeated.

The profile in the depth direction shown in FIG. 2 shows the result of the secondary ion intensity derived from the first liquid crystal compound (C1 in the drawing), the result of the secondary ion intensity derived from the second liquid crystal compound (C2 in the drawing), and the result of the secondary ion intensity derived from the photo-alignment compound (C3 in the drawing).

In this specification, the "secondary ion intensity derived from the first liquid crystal compound" obtained by the profile in the depth direction detected by analyzing the components of the optical laminate 10 in the depth direction by TOF-SIMS means an intensity of fragment ions derived from the first liquid crystal compound, the "secondary ion intensity derived from the second liquid crystal compound" means an intensity of fragment ions derived from the second liquid crystal compound, and the "secondary ion intensity derived from the photo-alignment compound" means an intensity of fragment ions derived from the photo-alignment compound.

As shown in FIG. 2, in a case where the components of the optical laminate 10 in the depth direction are analyzed by TOF-SIMS with ion beam irradiation from the surface of the optical laminate 10 on the side of the first optically anisotropic layer 12 toward the second optically anisotropic layer 16, first, the secondary ion intensity derived from the first liquid crystal compound in the first optically anisotropic layer 12 is observed to be high, and in a case where further ion beam irradiation is performed toward the depth direction, the secondary ion intensity derived from the first liquid crystal compound gradually decreases. It means that ion beams reach the mixed layer 14 from the first optically anisotropic layer 12. That is, since the component derived from the first liquid crystal compound is contained as a component constituting a part of the mixed layer 14, the secondary ion intensity derived from the first liquid crystal compound that is lower than the secondary ion intensity derived from the first liquid crystal compound of the first optically anisotropic layer is observed. Furthermore, in a case where component analysis in the depth direction is performed with ion beam irradiation toward the depth direction, ion beams reach from the mixed layer 14 to the second optically anisotropic layer 16, and the secondary ion intensity derived from the first liquid crystal compound is not observed.

In addition, as shown in FIG. 2, in a case where component analysis is performed from the first optically anisotropic layer 12 toward the second optically anisotropic layer 16, the secondary ion intensity derived from the second liquid crystal compound increases toward the second optically anisotropic layer 16. As described above, the mixed layer 14 contains the component derived from the second liquid crystal compound, and thus, first, the secondary ion intensity derived from the second liquid crystal compound is observed at the depth position of the mixed layer 14. Furthermore, in a case where component analysis is performed toward the depth direction, ion beams reach from the mixed layer 14 to the second optically anisotropic layer 16, and the secondary ion intensity derived from the second liquid crystal compound is highest.

As described above, the mixed layer 14 contains the component derived from the first liquid crystal compound and the component derived from the second liquid crystal compound, and thus a region at the depth position where both secondary ions derived from the first liquid crystal compound and secondary ions derived from the second liquid crystal compound are observed corresponds to the mixed layer 14.

As described above, in the mixed layer 14, the secondary ion intensity derived from the first liquid crystal compound gradually decreases in the depth direction. That is, in the mixed layer 14 in the optical laminate 10 according to one embodiment of the present invention, the concentration of the component derived from the first liquid crystal compound gradually decreases from the first optically anisotropic layer 12 toward the second optically anisotropic layer 16.

In addition, in the mixed layer 14, the secondary ion intensity derived from the second liquid crystal compound gradually increases in the depth direction. That is, in the mixed layer 14 in the optical laminate 10 according to one embodiment of the present invention, the concentration of the component derived from the second liquid crystal compound gradually increases from the first optically anisotropic layer 12 toward the second optically anisotropic layer 16.

In FIG. 2, the result of the secondary ion intensity derived from the photo-alignment compound (C3 in the drawing) is shown. Since the photo-alignment compound is contained in the mixed layer 14, as shown in FIG. 2, a high secondary ion intensity is observed mainly in a region where both secondary ions derived from the first liquid crystal compound and secondary ions derived from the second liquid crystal compound are observed.

In the profile in the depth direction shown in FIG. 2, a depth position of the mixed layer 14 where a secondary ion intensity derived from the photo-alignment compound is maximum is set as a peak position PP, a depth position of the mixed layer 14 closer to the first optically anisotropic layer 12 than the peak position PP, which exhibits a secondary ion intensity that is half of the secondary ion intensity at the peak position PP, is set as a first position P1, and a depth position closer to the second optically anisotropic layer 16 than the peak position PP, which exhibits a secondary ion intensity that is half of the secondary ion intensity at the peak position PP, is set as a second position P2.

In the mixed layer 14, as specified in the condition 1, secondary ions derived from the first liquid crystal compound and secondary ions derived from the second liquid crystal compound are detected at any depth position in a region between the first position P1 and the second position P2. In FIG. 2, secondary ions derived from the first liquid crystal compound and secondary ions derived from the second liquid crystal compound are detected in the whole region between the first position P1 and the second position P2.

In a case where the condition 1 is satisfied, the adhesiveness between the first optically anisotropic layer and the second optically anisotropic layer is good.

Furthermore, as shown in FIG. 2, in a case where a distance between the first position and the peak position is set as a first distance D1 and a distance between the second position and the peak position is set as a second distance D2, the second distance D2 is 50% or greater of a total of the first distance D1 and the second distance D2. That is, X represented by Expression (1) is 50% or greater.

$$X(\%) = \{D2/(D1+D2)\} \times 100 \quad \text{Expression (1)}$$

X is preferably 51% or greater, and more preferably 52% or greater. The upper limit is not particularly limited, but it is often 60% or less, and more often 59% or less.

In a case where the condition 2 is satisfied, the A plate or the layer obtained by fixing a twist-aligned liquid crystal phase, which is the second optically anisotropic layer 16, has good liquid crystal alignment properties. The fact that X is 50% or greater means that the photo-alignment compound contained in the mixed layer 14 is present in a large amount on the side of the second optically anisotropic layer 16. The photo-alignment compound in the mixed layer 14 has a horizontal alignment function. Therefore, the photo-alignment compound is present in a larger amount on the side of the second optically anisotropic layer 16 which is an A plate or a layer obtained by fixing a twist-aligned liquid crystal phase disposed on the mixed layer 14, so that the aligning properties of the second liquid crystal compound constituting the A plate or the layer obtained by fixing a twist-aligned liquid crystal phase are improved.

The photo-alignment group of the photo-alignment compound in the mixed layer 14 is aligned in a predetermined direction, so that the photo-alignment compound of the mixed layer 14 has a horizontal alignment function.

That is, the mixed layer 14 has a function of horizontally aligning the liquid crystal compound positioned thereon based on the function of the photo-alignment compound, and can function as a so-called horizontal alignment film. The horizontal alignment film is a film having properties in which the liquid crystal molecules disposed on a surface of the film are aligned horizontally with respect to the surface of the horizontal alignment film.

From the viewpoint that at least one of a further improvement in adhesiveness between the first optically anisotropic layer and the second optically anisotropic layer, or a further improvement in liquid crystal alignment properties of the A plate or the layer obtained by fixing a twist-aligned liquid crystal phase, which is the second optically anisotropic layer, is obtained (hereinafter, also simply referred to as "from the viewpoint that the effects of the present invention are further improved"), in a case where an intermediate position between the first position and the second position is set as a third position, and a depth position closer to the second position than the third position, which is between the first position and the second position, is set as a specific depth position, it is preferable that secondary ions derived from the first liquid crystal compound and the second liquid crystal compound are detected at any depth position in a region between the first position and the specific depth position.

Hereinafter, the above aspect will be described in detail using FIG. 2. An intermediate position between the first position P1 and the second position P2 is set as a third position P3. In addition, as shown in FIG. 2, a depth position closer to the second position P2 than the third position P3, which is between the first position P1 and the second position P2, is set as a specific depth position PD. In this aspect, it is preferable that secondary ions derived from the first liquid crystal compound and secondary ions derived from the second liquid crystal compound are detected at any depth position in a region between the first position P1 and the specific depth position PD, shown by the open arrow of FIG. 2.

In other words, it is preferable that secondary ions derived from the first liquid crystal compound and secondary ions derived from the second liquid crystal compound are detected at any position in a region between the first position P1 and the third position P3, and at any position in a region between the third position P3 and the specific depth position PD.

The position (depth position) of the specific depth position PD may be closer to the second position P2 than the third position P3, and is not particularly limited. The specific depth position is preferably the second position P2 from the viewpoint that the effects of the present invention are further improved. That is, it is more preferable that secondary ions derived from the first liquid crystal compound and secondary ions derived from the second liquid crystal compound are detected at any position in a region between the first position P1 and the second position P2.

Hereinafter, the members (first optically anisotropic layer, mixed layer, and second optically anisotropic layer) of the optical laminate will be described in detail.

<First Optically Anisotropic Layer>

The first optically anisotropic layer is a layer formed of a first liquid crystal compound.

The first optically anisotropic layer corresponds to a C plate. The first optically anisotropic layer may be a positive C plate or a negative C plate.

The first optically anisotropic layer is preferably a layer obtained by fixing an aligned first liquid crystal compound. In particular, the first optically anisotropic layer is preferably a C plate obtained by fixing an aligned first liquid crystal compound having a polymerizable group. Examples of the fixing method include a curing treatment (polymerization reaction) as will be described in detail later.

In this specification, the "fixed" state is a state in which the alignment of the liquid crystal compound is maintained. Specifically, the state is preferably a state in which the layer has no fluidity usually at 0° C. to 50° C., and even under more severe conditions of a temperature range of −30° C. to 70° C., and the fixed alignment is stably maintained without change in alignment due to an external field or an external force.

Examples of the first liquid crystal compound include known liquid crystal compounds.

In general, liquid crystal compounds can be classified into a rod-like type and a disk-like type according to the shape thereof. Furthermore, each type includes a low molecular type and a high molecular type. The term high molecular generally refers to a compound having a degree of polymerization of 100 or greater (Polymer Physics-Phase Transition Dynamics, written by Masao Doi, p. 2, published by Iwanami Shoten, 1992). As the first liquid crystal compound, a rod-like liquid crystal compound or a discotic liquid crystal compound is preferable, and a rod-like liquid crystal compound is more preferable.

For fixing of the first liquid crystal compound described above, a first liquid crystal compound having a polymerizable group is preferably used.

The first liquid crystal compound having a polymerizable group preferably has two or more polymerizable groups in one molecule.

In a case where two or more types of first liquid crystal compounds are used, at least one type of first liquid crystal compound preferably has two or more polymerizable groups in one molecule.

After fixing of the first liquid crystal compound by polymerization, it is no longer necessary for the first optically anisotropic layer to exhibit liquid crystallinity.

The type of the polymerizable group is not particularly limited. A functional group allowing an addition polymerization reaction is preferable, and a polymerizable ethylenically unsaturated group or a cyclic polymerizable group is preferable. More specifically, preferable examples thereof include a (meth)acryloyl group, a vinyl group, a styryl group, and an allyl group, and a (meth)acryloyl group is more preferable. A (meth)acryloyl group is a concept referring to a methacryloyl group or an acryloyl group.

As the rod-like liquid crystal compound, for example, those described in claim 1 of JP1999-513019A (JP-H11-513019A) or paragraphs [0026] to [0098] of JP2005-289980A can be preferably used, and as the discotic liquid crystal compound, for example, those described in paragraphs [0020] to [0067] of JP2007-108732A or paragraphs [0013] to [0108] of JP2010-244038A can be preferably used. However, the examples are not limited thereto.

In addition, in the present invention, as the first liquid crystal compound, a liquid crystal compound having reverse wavelength dispersibility can be used.

Here, in this specification, the liquid crystal compound having "reverse wavelength dispersibility" refers to the fact that in the measurement of an in-plane retardation (Re) value of a retardation film formed of the compound at a specific wavelength (visible light range), as the measurement wavelength increases, the Re value is the same or increased.

The liquid crystal compound having reverse wavelength dispersibility is not particularly limited as long as a film having reverse wavelength dispersibility can be formed as described above, and examples thereof include the compounds represented by General Formula (1) described in JP2010-084032A (particularly, the compounds described in paragraphs [0067] to [0073]), the compounds represented by General Formula (II) described in JP2016-053709A (particularly, the compounds described in paragraphs [0036] to [0043]), and the compounds represented by General Formula (1) described in JP2016-081035A (particularly, the compounds described in paragraphs [0043] to [0055]).

As will be described in detail later, the first optically anisotropic layer is formed of a first liquid crystal compound. In a case where a first liquid crystal compound having a polymerizable group is used, the first optically anisotropic layer contains a cured product (polymer) of the first liquid crystal compound. That is, the first optically anisotropic layer contains at least a component derived from the first liquid crystal compound. In this specification, the component derived from the first liquid crystal compound is a concept including the first liquid crystal compound itself and a cured product (polymer) of the first liquid crystal compound.

The content of the component derived from the first liquid crystal compound in the first optically anisotropic layer is not particularly limited, and is preferably 60 to 100 mass %, and more preferably 80 to 100 mass % with respect to the total mass of the first optically anisotropic layer.

The first optically anisotropic layer may contain a component other than the component derived from the first liquid crystal compound. The first liquid crystal compound may contain a photo-alignment compound on the surface side of the mixed layer.

The thickness of the first optically anisotropic layer is not particularly limited, and is preferably 0.1 to 10 μm, and more preferably 0.1 to 5 μm.

The thickness-direction retardation of the first optically anisotropic layer is not particularly limited, and from the viewpoint that the reflectivity of a circularly polarizing plate in an oblique direction can be reduced, the thickness-direction retardation at a wavelength of 550 nm is preferably −10 to −120 nm, and more preferably −20 to −90 nm.

<Mixed Layer>

The mixed layer is a layer disposed between the first optically anisotropic layer and the second optically anisotropic layer. The mixed layer contains a component derived from the first liquid crystal compound and a component derived from the second liquid crystal compound. That is, the mixed layer is a layer containing a main component of the first optically anisotropic layer (component derived from the first liquid crystal compound) and a main component of the second optically anisotropic layer (component derived from the second liquid crystal compound).

The component derived from the first liquid crystal compound is as described above. The component derived from the second liquid crystal compound will be described in detail later.

The mixed layer further contains a photo-alignment compound. The photo-alignment compound is a compound which mainly controls the aligning properties of the liquid crystal compound constituting the second optically anisotropic layer to be described later.

The photo-alignment compound has a photo-alignment group.

The photo-alignment group is preferably a group in which at least one of dimerization or isomerization is caused by the action of light.

Specific suitable examples of the group which is dimerized by the action of light include groups having a skeleton of at least one derivative selected from the group consisting of a cinnamic acid derivative, a coumarin derivative, a chalcone derivative, a maleimide derivative, and a benzophenone derivative.

Specific suitable examples of the group which is isomerized by the action of light include groups having a skeleton of at least one compound selected from the group consisting of an azobenzene compound, a stilbene compound, a spiropyran compound, a cinnamic acid compound, and a hydrazono-β-ketoester compound.

Among such photo-alignment groups, groups having a skeleton of at least one derivative or compound selected from the group consisting of a cinnamic acid derivative, a coumarin derivative, a chalcone derivative, a maleimide derivative, an azobenzene compound, a stilbene compound, and a spiropyran compound are preferable. Among these, from the viewpoint that the liquid crystal alignment properties of the second optically anisotropic layer are further improved, a group having a skeleton of a cinnamic acid derivative or an azobenzene compound is more preferable, a group having a skeleton of a cinnamic acid derivative (hereinafter, also abbreviated as "cinnamoyl group") is even more preferable, and a group represented by Formula (a1) is particularly preferable.

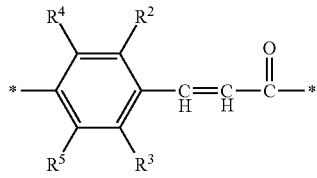

(a1)

In Formula (a1), two *'s each represent a bonding position. $R^2$ to $R^5$ each independently represent a hydrogen atom or a substituent, and two adjacent groups may be bonded to form a ring.

In the present invention, the photo-alignment group represented by Formula (a1) is preferably a photo-alignment group represented by Formula (a2).

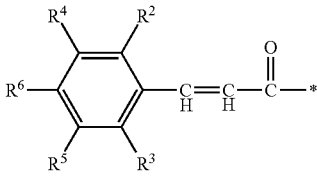

(a2)

In Formula (a2), * represents a bonding position, $R^2$ to $R^6$ each independently represent a hydrogen atom or a substituent, and two adjacent groups may be bonded to form a ring.

Here, from the viewpoint that the effects of the present invention are further improved, the substituents represented by one aspect of $R^2$ to $R^6$ each independently preferably represent a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (a3).

Specific examples of the substituents other than the group represented by Formula (a3) include the same ones as those described for the substituent represented by one aspect of $R^1$ in Formula (A).

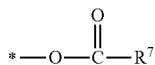

(a3)

Here, in Formula (a3), * represents a bonding position with a benzene ring in Formula (a2), and $R^7$ represents a monovalent organic group.

Examples of the monovalent organic group represented by $R^7$ in Formula (a3) include a linear or cyclic alkyl group having 1 to 20 carbon atoms.

The linear alkyl group is preferably an alkyl group having 1 to 6 carbon atoms, and specific examples thereof include a methyl group, an ethyl group, and an n-propyl group. Among these, a methyl group or an ethyl group is preferable.

The cyclic alkyl group is preferably an alkyl group having 3 to 6 carbon atoms, and specific examples thereof include a cyclopropyl group, a cyclopentyl group, and a cyclohexyl group. Among these, a cyclohexyl group is preferable.

The monovalent organic group represented by $R^7$ in Formula (a3) may be obtained by combining the linear alkyl group and the cyclic alkyl group described above directly or via a single bond.

In the present invention, from the viewpoint that the effects of the present invention are further improved, at least one of $R^2$ to $R^5$ in Formula (a1) or at least one (particularly $R^6$) of $R^2$ to $R^6$ in Formula (a2) is preferably the above-described substituent, and from the viewpoint that the reaction efficiency is improved during polarized light irradiation, at least one of $R^2$ to $R^5$ in Formula (a1) or at least one (particularly $R^6$) of $R^2$ to $R^6$ in Formula (a2) is more preferably an electron-donating substituent.

Here, the electron-donating substituent (electron-donating group) refers to a substituent having a Hammett constant (Hammett substituent constant σp) of 0 or less, and examples thereof include an alkyl group, a halogenated alkyl group, and an alkoxy group.

Among these, an alkoxy group is preferable, and from the viewpoint that the effects of the present invention are further improved, an alkoxy group having 6 to 16 carbon atoms is more preferable, and an alkoxy group having 7 to 10 carbon atoms is even more preferable.

The photo-alignment compound preferably further has a hydroxyl group or a ketone group. In a case where the photo-alignment compound has a hydroxyl group or a ketone group, the liquid crystal alignment properties of the first optically anisotropic layer are further improved.

The photo-alignment compound is preferably a polymer. That is, the photo-alignment compound is preferably a photo-alignment polymer.

In particular, the photo-alignment compound preferably has a repeating unit containing a photo-alignment group and a repeating unit containing a hydroxyl group or a ketone group.

The structure of a main chain of the repeating unit having a photo-alignment group is not particularly limited, and examples thereof include known structures. For example, a skeleton selected from the group consisting of a (meth) acrylic skeleton, a styrene-based skeleton, a siloxane-based skeleton, a cycloolefin-based skeleton, a methylpentene-based skeleton, an amide-based skeleton, and an aromatic ester-based skeleton is preferable.

Among these, a skeleton selected from the group consisting of a (meth)acrylic skeleton, a siloxane-based skeleton, and a cycloolefin-based skeleton is more preferable, and a (meth)acrylic skeleton is even more preferable.

In addition, in the repeating unit containing a photo-alignment group, the photo-alignment group may be bonded to a main chain of the photo-alignment polymer via a linking group. As the linking group, a linking group containing a cycloalkane ring is preferable, and a linking group containing a nitrogen atom and a cycloalkane ring is more preferable.

The content of the repeating unit containing a photo-alignment group in the photo-alignment compound is not particularly limited, and is preferably 5 to 60 mass %, more preferably 10 to 50 mass %, and even more preferably 15 to 40 mass % with respect to all the repeating units of the photo-alignment compound (photo-alignment polymer) from the viewpoint that the effects of the present invention are further improved.

(Repeating Unit Containing Hydroxyl Group)

Examples of the repeating unit containing a hydroxyl group include a repeating unit represented by Formula (B) (hereinafter, also abbreviated as "repeating unit B").

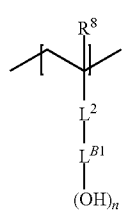

(B)

In Formula (B), $R^8$ represents a hydrogen atom or a substituent. Examples of the substituent represented by one aspect of $R^8$ include the same ones as those described for the substituent represented by one aspect of $R^1$ in Formula (A).

In addition, in Formula (B), $L^2$ represents a divalent linking group. Examples of the divalent linking group represented by $L^2$ include the same ones as those described for the divalent linking group represented by $L^1$ in Formula (A).

In addition, in Formula (B), n represents an integer of 1 or more, and is preferably an integer of 1 to 10, more preferably an integer of 1 to 5, and even more preferably an integer of 1 to 3 from the viewpoint that the effects of the present invention are further improved.

In addition, in Formula (B), $L^{B1}$ represents an n+1-valent linking group.

In the present invention, from the viewpoint that the effects of the present invention are further improved, $L^{B1}$ in Formula (B) preferably represents an n+1-valent aliphatic hydrocarbon group having one or more carbon atoms.

Here, the aliphatic hydrocarbon group is n+1-valent. Therefore, for example, in a case where n is 1, the aliphatic hydrocarbon group is a divalent aliphatic hydrocarbon group (so-called alkylene group), in a case where n is 2, the aliphatic hydrocarbon group is a trivalent aliphatic hydrocarbon group, and in a case where n is 3, the aliphatic hydrocarbon group is a tetravalent aliphatic hydrocarbon group.

In addition, the aliphatic hydrocarbon group may be linear or branched.

In addition, the aliphatic hydrocarbon group may have a cyclic structure.

The number of carbon atoms contained in the n+1-valent linking group is not particularly limited, and is preferably 1 to 24, and more preferably 1 to 10.

The content of the repeating unit containing a hydroxyl group in the photo-alignment compound is not particularly limited, and is preferably 3 mass % or greater, more preferably 5 mass % or greater, even more preferably 10 mass % or greater, particularly preferably 20 mass % or greater, preferably 95 mass % or less, more preferably 80 mass % or less, even more preferably 60 mass % or less, particularly preferably 50 mass % or less, and most preferably 30 mass % or less with respect to all the repeating units of the photo-alignment compound (photo-alignment polymer) from the viewpoint that the effects of the present invention are further improved.

The content of the component derived from the first liquid crystal compound in the mixed layer is not particularly limited, and is preferably 10 to 90 mass %, and more preferably 30 to 70 mass % with respect to the total mass of the mixed layer.

The content of the component derived from the second liquid crystal compound in the mixed layer is not particularly limited, and is preferably 10 to 90 mass %, and more preferably 30 to 70 mass % with respect to the total mass of the mixed layer.

The content of the photo-alignment compound in the mixed layer is not particularly limited, and is preferably 10 to 90 mass %, and more preferably 30 to 70 mass % with respect to the total mass of the mixed layer.

In the optical laminate according to the embodiment of the present invention, it is preferable that a fluorine atom and a silicon atom are substantially not present in the mixed layer from the viewpoint that the adhesiveness between the first optically anisotropic layer and the second optically anisotropic layer is improved, and that cissing is suppressed due to improved liquid crystal alignment properties of the optically anisotropic layer provided as an upper layer.

Here, the expression "substantially not present" means that the content, measured by X-ray photoelectron spectroscopy (X-ray photoelectron spectroscopy or ESCA: electron spectroscopy for chemical analysis: XPS), is equal to or less than a detection value (0.1% or less).

The thickness of the mixed layer is not particularly limited, and is preferably 1 to 1,000 nm, and more preferably 10 to 500 nm.

The thickness of the mixed layer corresponds to a depth region where secondary ions of both the component derived from the first liquid crystal compound and the component derived from the second liquid crystal compound are observed in the analysis of the depth of the optical laminate in TOF-SIMS.

<Second Optically Anisotropic Layer>

The second optically anisotropic layer is a layer formed of a second liquid crystal compound.

The second optically anisotropic layer corresponds to an A plate or a layer obtained by fixing a twist-aligned liquid crystal phase.

The second optically anisotropic layer may be a positive A plate or a negative A plate.

The second optically anisotropic layer is preferably a layer obtained by fixing an aligned second liquid crystal compound. In particular, the second optically anisotropic layer is preferably an A plate obtained by fixing an aligned second liquid crystal compound having a polymerizable group. Examples of the fixing method include a curing treatment (polymerization reaction) as will be described in detail later.

In a case where the second optically anisotropic layer is a layer obtained by fixing a twist-aligned liquid crystal phase, the second optically anisotropic layer may have a plurality of regions where different alignment states of liquid crystal compounds are fixed along the thickness direction.

The type of the second liquid crystal compound is not particularly limited, and examples thereof include those exemplified as the first liquid crystal compound described above.

In a case where the second optically anisotropic layer is a layer obtained by fixing a twist-aligned liquid crystal phase, a chiral agent is preferably used to twist-align the liquid crystal compound in the second optically anisotropic layer. The chiral agent has a function of inducing a spiral structure of a liquid crystal compound. Since the sense or spiral pitch of the spiral to be induced vary from compound to compound, the chiral agent may be selected according to the purpose.

Known compounds can be used as the chiral agent, and the chiral agent preferably has a cinnamoyl group. An isosorbide derivative, an isomannide derivative, or a binaphthyl derivative is preferable as the chiral agent. As an isosorbide derivative, a commercially available product such as LC-756 manufactured by BASF SE may be used.

The content of the chiral agent in the second optically anisotropic layer is preferably 0.01 to 100 parts by mass, and more preferably 0.1 to 15 parts by mass with respect to 100 parts by mass of the liquid crystal compound.

The thickness of the second optically anisotropic layer is not particularly limited, and is preferably 0.1 to 10 µm, and more preferably 0.5 to 5 µm.

The in-plane direction retardation of the second optically anisotropic layer is not particularly limited, and from the viewpoint of functioning as a λ/4 plate, the in-plane direction retardation at a wavelength of 550 nm is preferably 100 to 180 nm, and more preferably 120 to 160 nm.

The thickness of the optical laminate is not particularly limited. The total thickness of the first optically anisotropic layer, the mixed layer, and the second optically anisotropic layer described above is preferably 0.2 to 10 µm, more preferably 0.5 to 5 µm, and even more preferably 1 to 4 µm.

The optical laminate may include a layer other than the first optically anisotropic layer, the mixed layer, and the second optically anisotropic layer described above.

Examples of other layers include a support. An alignment layer may be further disposed on the support.

Examples of the support include a glass substrate and a polymer film.

Examples of the material of the polymer film include cellulose-based polymers; acrylic polymers such as polymethyl methacrylate; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer; polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an alignment layer may be disposed on the support. The support may be peeled off after formation of the optical laminate.

The thickness of the support is not particularly limited, and is preferably 5 to 200 µm, more preferably 10 to 100 µm, and even more preferably 20 to 90 µm.

<Method of Manufacturing Optical Laminate>

The method of manufacturing the above-described optical laminate is not particularly limited, and is preferably a manufacturing method having the following steps 1 to 4 from the viewpoint of excellent productivity.

Step 1: a step of forming a coating film by using a first optically anisotropic layer forming composition (hereinafter, also abbreviated as "first composition") containing a first liquid crystal compound having a polymerizable group and a photo-alignment polymer (hereinafter, also abbreviated as "cleavage group-containing photo-alignment polymer") having a repeating unit containing a cleavage group which is decomposed by the action of at least one selected from the group consisting of light, heat, acid, and base to produce a hydroxyl group or a ketone group.

Step 2: a step of forming a first optically anisotropic layer by subjecting the obtained coating film to a treatment for cleaving the cleavage group to produce a hydroxyl group or a ketone group, and a curing treatment for aligning and curing the first liquid crystal compound.

Step 3: a step of subjecting the first optically anisotropic layer obtained in the step 2 to a photo-alignment treatment.

Step 4: a step of forming a second optically anisotropic layer on the surface of the first optically anisotropic layer subjected to the photo-alignment treatment by using a second optically anisotropic layer forming composition (hereinafter, also abbreviated as "second composition") containing a second liquid crystal compound having a polymerizable group.

In the above procedure, a first optically anisotropic layer in which the photo-alignment polymer is unevenly distributed on one surface is obtained by performing the steps 1 to 3. Then, in a case where a second optically anisotropic layer is formed by applying the second composition to the surface of the first optically anisotropic layer in which the photo-alignment polymer is unevenly distributed in the step 4, the second liquid crystal compound in the second composition penetrates inside of the first optically anisotropic layer from the surface of the first optically anisotropic layer, and as a result, the above-described mixed layer is formed between the first optically anisotropic layer and the second optically anisotropic layer. The position where the photo-alignment polymer is unevenly distributed in the mixed layer can be adjusted by changing the conditions of the procedure in the above steps or by controlling the structure (for example, the type of cleavage group) of the photo-alignment polymer to be used.

Hereinafter, the steps will be described in detail.

(Step 1)

The step 1 is a step of forming a coating film by using a first composition containing a first liquid crystal compound having a polymerizable group and a cleavage group-containing photo-alignment polymer.

The first liquid crystal compound having a polymerizable group contained in the first composition is as described above.

[Cleavage Group-Containing Photo-Alignment Polymer]

Examples of the cleavage group-containing photo-alignment polymer include a polymer having a repeating unit having a group represented by Formula (1), which produces the repeating unit (repeating unit B) represented by Formula (B) by the action of an acid.

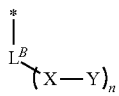
(1)

In Formula (1), $L^B$ is the same as $L^{B1}$ in Formula (B).

X represents a cleavage group which is decomposed by the action of an acid to produce a hydroxyl group.

Y represents a group containing a fluorine atom or a silicon atom.

n represents an integer of 1 or more.

* represents a bonding position.

Examples of the cleavage group represented by X include cleavage groups represented by Formulae (B1) to (B5).

* in Formulae (B1) to (B5) represents a bonding position.

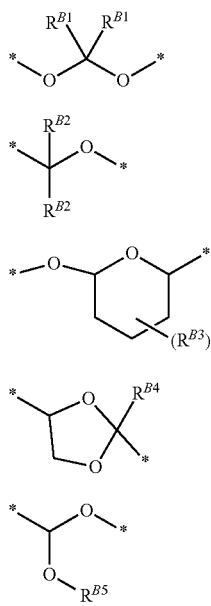

In Formula (B1), $R^{B1}$'s each independently represent a hydrogen atom or a substituent. At least one of the two $R^{B1}$'s represents a substituent, and the two $R^{B1}$'s may be bonded to each other to form a ring.

In Formula (B2), $R^{B1}$'s each independently represent a substituent. The two $R^{B1}$'s may be bonded to each other to form a ring.

In Formula (B3), $R^{B3}$ represents a substituent, and m represents an integer of 0 to 3. In a case where m is 2 or 3, a plurality of $R^{B3}$ may be the same or different from each other.

In Formula (B4), $R^{B4}$ represents a hydrogen atom or a substituent.

In Formula (B5), $R^{B5}$ represents a substituent.

n represents an integer of 1 or more. In the above range, the integer is preferably 1 to 10, more preferably 1 to 5, and even more preferably 1 to 3 since the liquid crystal alignment properties are improved.

Specific examples of the repeating unit having a group represented by Formula (1) are as follow.

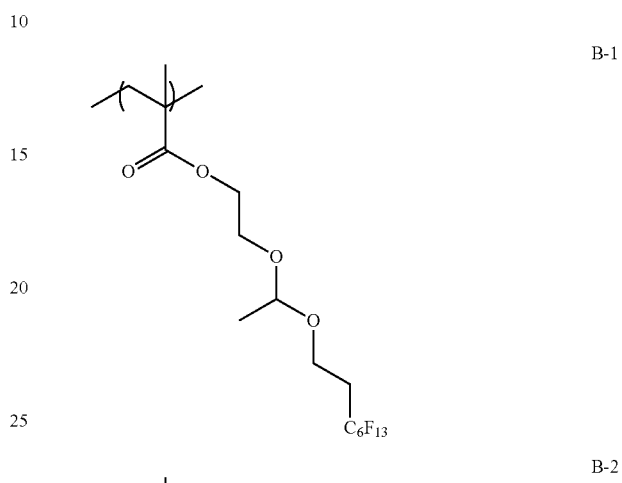

B-5
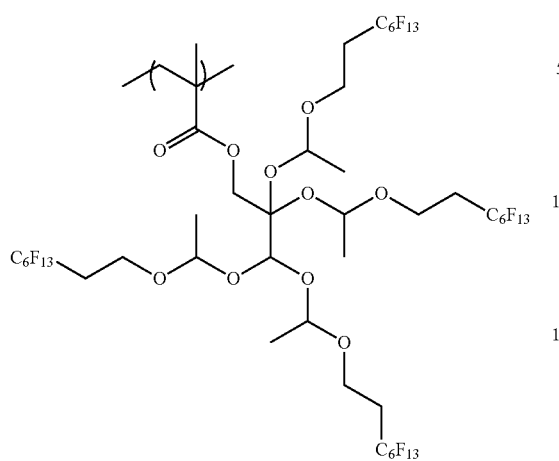
B-6
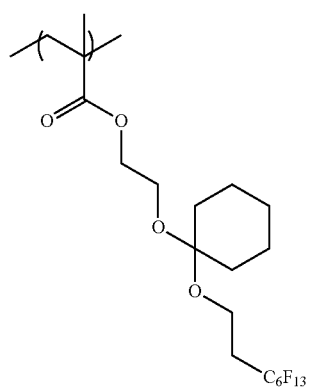
B-7
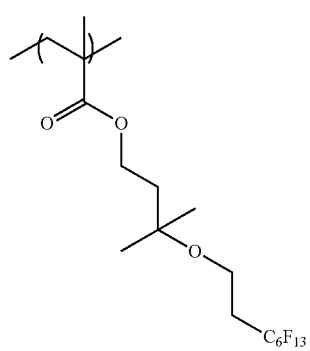
B-8
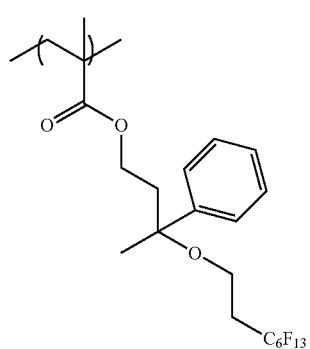
B-9
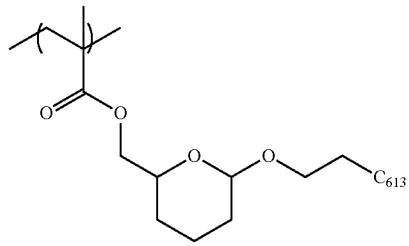
Specific examples of the cleavage group-containing photo-alignment polymer which is decomposed by the action of an acid to produce a ketone group are as follows.
B-10
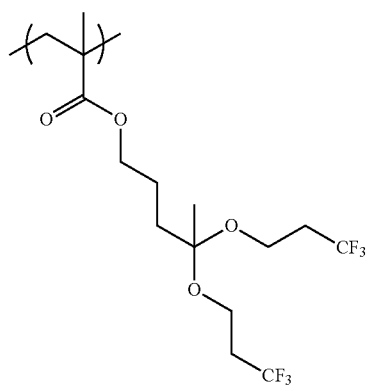
B-11
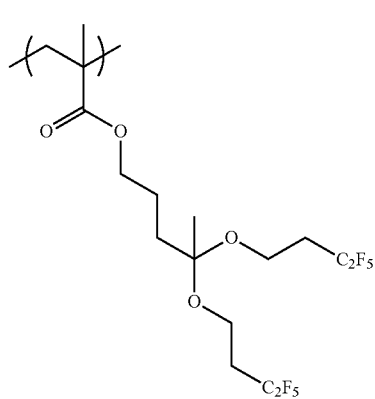
B-12
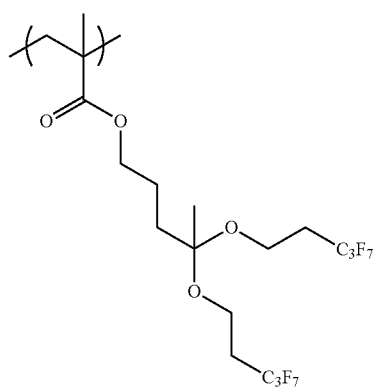

B-13
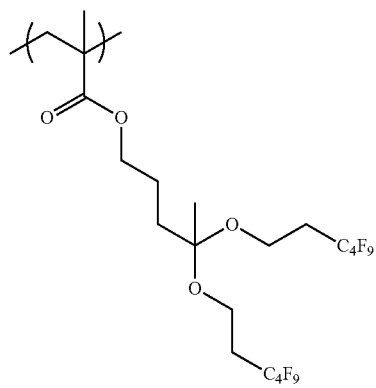
B-14
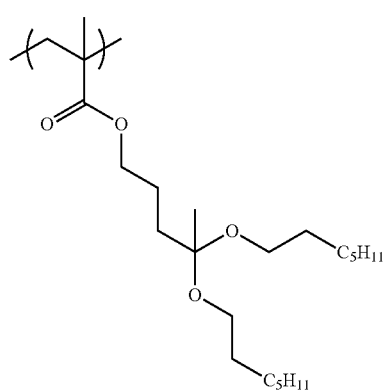
B-15
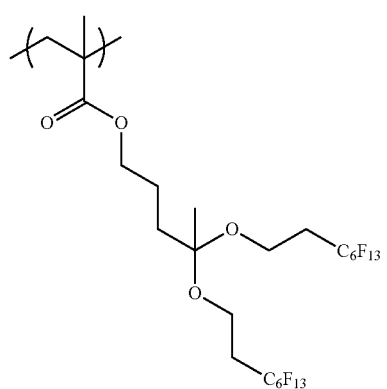
B-16
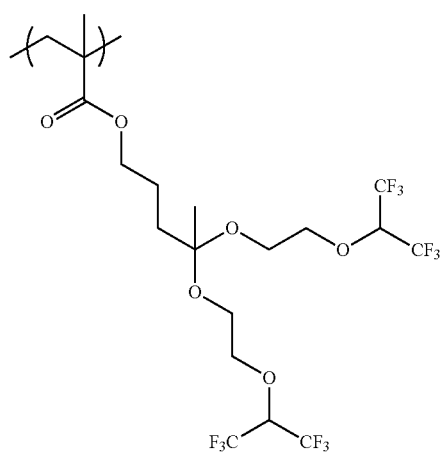
B-17
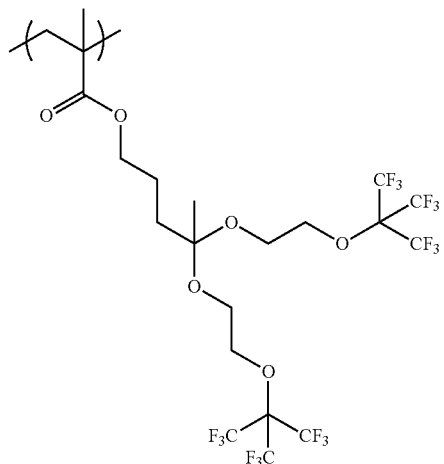
B-18
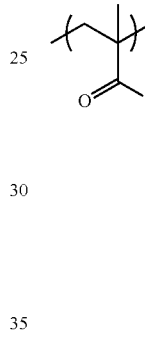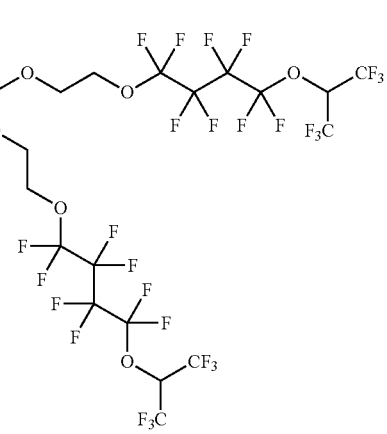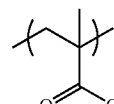
B-19
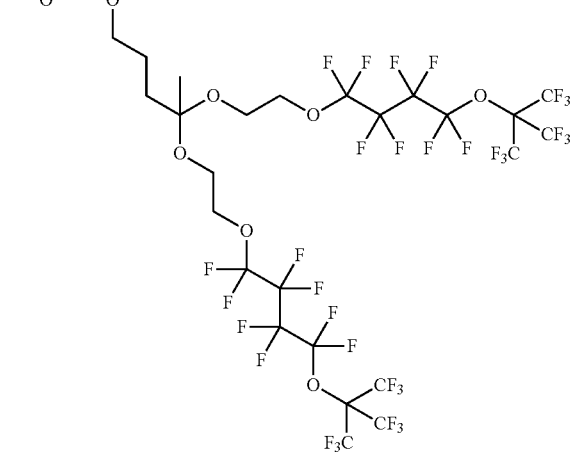

B-20
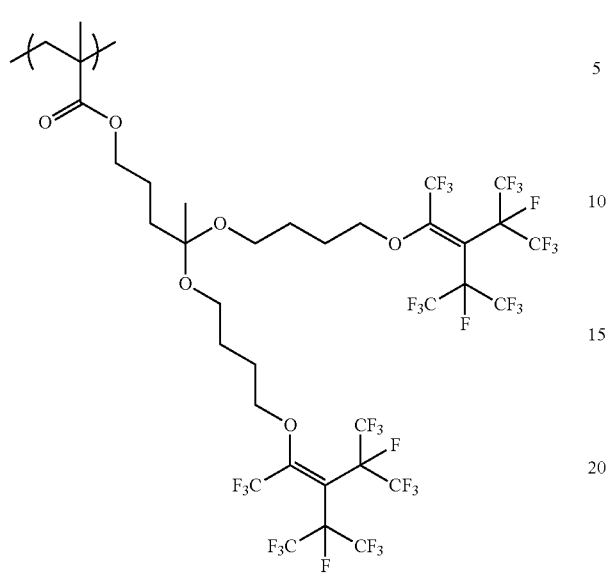
B-21
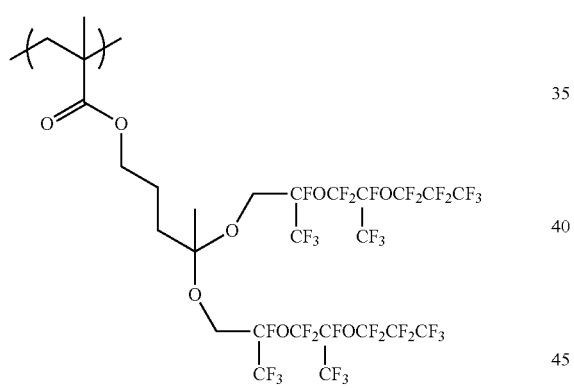
B-22
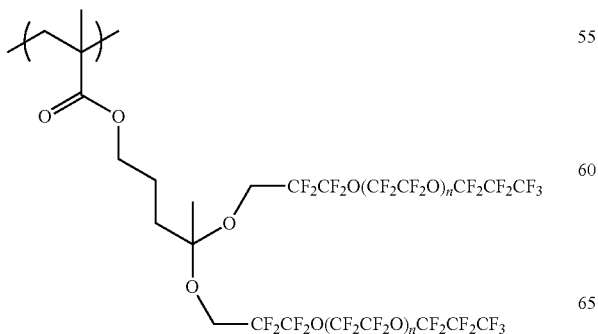
B-23
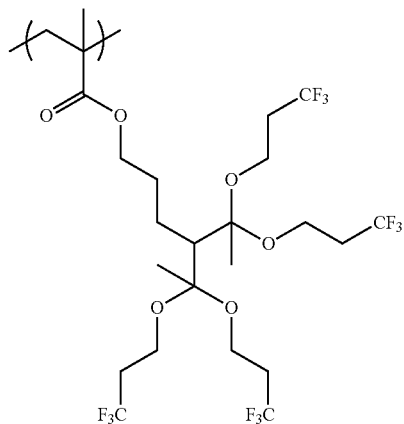
B-24
B-25
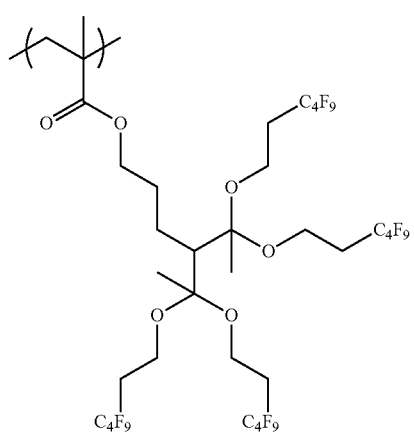

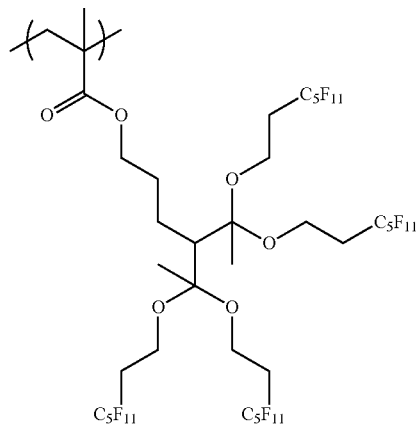
B-26
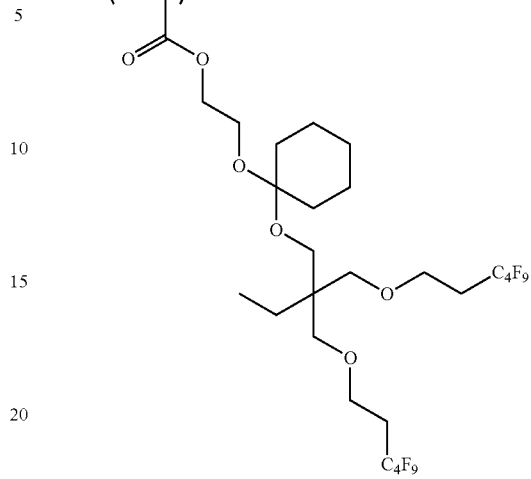
B-29
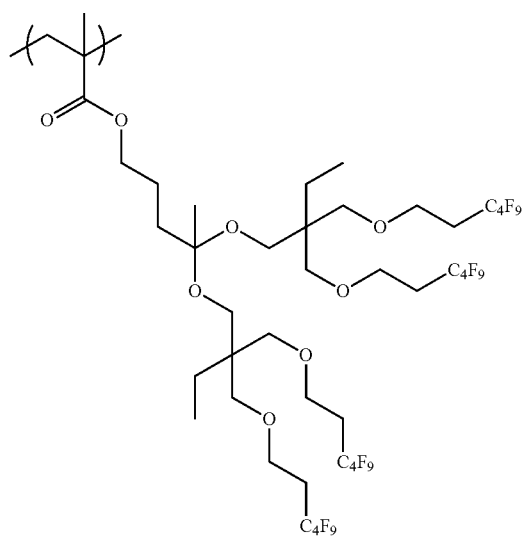
B-27
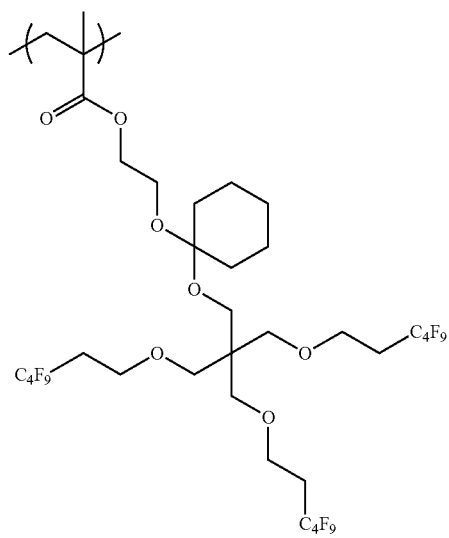
B-30
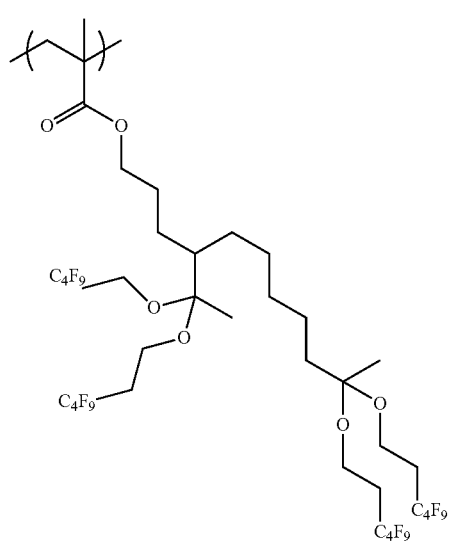
B-28
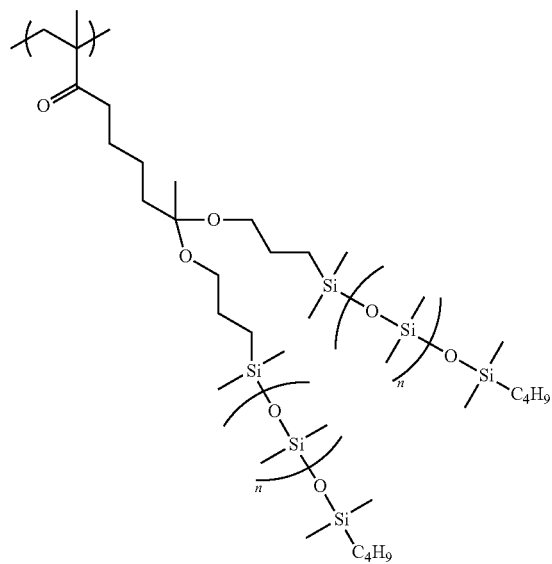
B-31

B-32

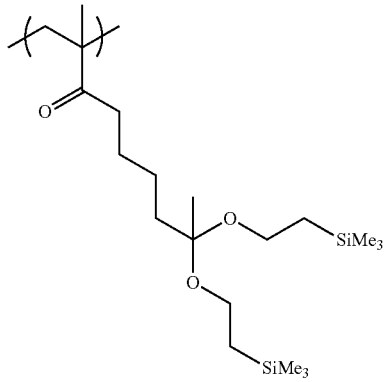

The first composition may contain a component other than the first liquid crystal compound having a polymerizable group and the cleavage group-containing photo-alignment polymer. Examples of other components include a photo-acid generator, a polymerization initiator, a solvent, a crosslinking agent, a surfactant, a hydrophilic compound, a vertical alignment agent, a horizontal alignment agent, and an amine compound.

The photo-acid generator is not particularly limited, and is preferably a compound which is sensitive to actinic rays having a wavelength of 300 nm or greater, preferably 300 to 450 nm, and generates an acid. A photo-acid generator which is not directly sensitive to actinic rays having a wavelength of 300 nm or greater can also be preferably used in combination with a sensitizer as long as it is a compound which is sensitive to actinic rays having a wavelength of 300 nm or greater and generates an acid by being used in combination with the sensitizer.

Examples of the photo-acid generator include an onium salt compound, trichloromethyl-s-triazines, a sulfonium salt, an iodonium salt, quaternary ammonium salts, a diazomethane compound, an imidosulfonate compound, and an oxime sulfonate compound. Among these, an onium salt compound, an imidosulfonate compound, or an oxime sulfonate compound is preferable, and an onium salt compound or an oxime sulfonate compound is more preferable. The photo-acid generators can be used alone or in combination of two or more types thereof.

The polymerization initiator is not particularly limited, and examples thereof include a thermal polymerization initiator and a photopolymerization initiator depending on the method of a polymerization reaction.

The polymerization initiator is preferably a photopolymerization initiator capable of initiating a polymerization reaction by ultraviolet irradiation.

Examples of the photopolymerization initiator include α-carbonyl compounds (described in U.S. Pat. Nos. 2,367,661A and 2,367,670A), acyloin ethers (described in U.S. Pat. No. 2,448,828A), α-hydrocarbon-substituted aromatic acyloin compounds (described in U.S. Pat. No. 2,722,512A), polynuclear quinone compounds (described in U.S. Pat. Nos. 3,046,127A and 2,951,758A), combinations of triarylimidazole dimer and p-aminophenyl ketone (described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acylphosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

Examples of the solvent include ketones (for example, acetone, 2-butanone, methyl isobutyl ketone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide).

The solvents may be used alone or in combination of two or more types thereof.

Examples of the crosslinking agent include a compound having an epoxy group or an oxetanyl group, a blocked isocyanate compound, and an alkoxymethyl group-containing compound.

Examples of the surfactant include compounds which have been known. Examples thereof include a surfactant having a fluorine atom and a surfactant having a silicon atom. In the present invention, from the viewpoint of not inhibiting the direct lamination of the first optically anisotropic layer and the second optically anisotropic layer, the optically anisotropic layer forming composition for forming an optically anisotropic layer which is positioned as a lower layer of the optical laminate preferably does not contain a surfactant having a fluorine atom or a surfactant having a silicon atom, and more preferably does not contain both the surfactant having a fluorine atom and the surfactant having a silicon atom. In a case where the optical laminate is formed in this manner, it is possible to obtain an optical laminate in which a fluorine atom or a silicon atom is substantially not present in the mixed layer.

In a case where the surfactant is used, the content of the surfactant is preferably 0.01 to 5 mass %, and more preferably 0.05 to 3 mass % with respect to the total mass of the liquid crystal compound.

The hydrophilic compound is preferably a compound capable of fixing the alignment of the liquid crystal compound in a vertical direction, and examples thereof include the polymer compounds described in paragraphs [0042] to [0046] in JP6739535B.

The content of the hydrophilic compound is preferably 0.5 to 10 mass % with respect to the liquid crystal compound.

The vertical alignment agent may have a function of promoting the vertical alignment of the liquid crystal compound. Examples thereof include an ionic compound and a boronic acid compound.

The content of the vertical alignment agent is preferably 0.1 to 5 mass %, and more preferably 0.5 to 3 mass % with respect to the total mass of the liquid crystal compound. Only one type of vertical alignment agent, or two or more types of vertical alignment agents may be contained. In a case where two or more types are contained, the total amount thereof is preferably within the above range.

The horizontal alignment agent may have a function of promoting the horizontal alignment of the liquid crystal compound.

The content of the horizontal alignment agent is preferably 0.1 to 5 mass % with respect to the total mass of the liquid crystal compound.

The amine compound may have a function of not deteriorating the aligning properties of the liquid crystal compound in a case where the first composition is stored for several days (for example, about one week) after being prepared. As such an amine compound, an amine compound having a boiling point of 50° C. to 230° C. and having no proton on the nitrogen atom is preferable, secondary amine and tertiary amine are more preferable, and diisopropylethylamine or tributylamine is even more preferable.

The content of the amine compound is preferably 0.01 to 10 mass % with respect to the total mass of the liquid crystal compound.

[Procedure of Step 1]

The method of forming a coating film by using the first composition is not particularly limited, and examples thereof include a method including performing coating with the first composition on a support and optionally performing a drying treatment.

The support is as described above.

The method of performing coating with the first composition is not particularly limited, and examples thereof include a spin coating method, an air knife coating method, a curtain coating method, a roller coating method, a wire bar coating method, a gravure coating method, and a die coating method.

(Step 2)

The step 2 is a step of forming a first optically anisotropic layer by subjecting the obtained coating film to a treatment for cleaving the cleavage group to produce a hydroxyl group or a ketone group (hereinafter, also simply referred to as "cleavage treatment"), and a curing treatment for aligning and curing the first liquid crystal compound (hereinafter, also simply referred to as "curing treatment").

One of the cleavage treatment and the curing treatment may be performed, and then the other treatment may be performed. Otherwise, the treatments may be performed at the same time.

As the cleavage treatment, an optimum treatment is selected according to the type of the cleavage group in the cleavage group-containing photo-alignment polymer to be used. For example, in a case where the cleavage group in the polymer is a cleavage group which is decomposed by the action of an acid to produce a hydroxyl group, examples of the cleavage treatment include an acid generation treatment.

The cleavage treatment is preferably an acid generation treatment from the viewpoint of productivity and ease of cleavage of the cleavage group.

The acid generation treatment is a treatment for generating an acid from the photo-acid generator in the coating film. Specifically, it is a treatment for generating an acid by irradiation with light to which the photo-acid generator contained in the coating film is exposed. By performing this treatment, cleavage at the cleavage group proceeds, and a hydroxyl group or a ketone group is generated. That is, for example, after the polymer having the repeating unit having a group represented by Formula (1) is subjected to cleavage through this treatment, Y, which is a group containing a fluorine atom or a silicon atom, is eliminated, and only the polymer having the repeating unit B having a hydroxyl group remains in the first optically anisotropic layer.

The light irradiation treatment performed in the above treatment may be a treatment in which the photo-acid generator is exposed to light, and examples thereof include an ultraviolet irradiation method. As a light source, a lamp emitting ultraviolet rays, such as a high-pressure mercury lamp and a metal halide lamp, can be used. In addition, the irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$.

The curing treatment is a treatment for aligning and curing the first liquid crystal compound in the coating film. Through this treatment, the aligned liquid crystal compound can be fixed.

The treatment for aligning the first liquid crystal compound is not particularly limited, and examples thereof include a heat treatment.

The conditions of the heat treatment are not particularly limited, and the heating temperature is preferably 30° C. to 120° C., and more preferably 50° C. to 100° C. The heating time is preferably 10 to 600 seconds, and more preferably 30 to 300 seconds.

Examples of the treatment for curing the aligned first liquid crystal compound include a light irradiation treatment.

The light irradiation treatment is not particularly limited, and examples thereof include a method of irradiating ultraviolet rays. As a light source, a lamp emitting ultraviolet rays, such as a high-pressure mercury lamp and a metal halide lamp, can be used. In addition, the irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$.

The light irradiation treatment in the acid generation treatment and the light irradiation treatment in the curing treatment may be performed at the same time.

(Step 3)

The step 3 is a step of subjecting the first optically anisotropic layer obtained in the step 2 to a photo-alignment treatment.

Examples of the photo-alignment treatment include a method of irradiating the first optically anisotropic layer obtained in the step 2 with polarized light or irradiating the surface of the coating film with unpolarized light from an oblique direction.

In the photo-alignment treatment, the polarized light to be applied is not particularly limited. Examples thereof include linearly polarized light, circularly polarized light, and elliptically polarized light, and linearly polarized light is preferable.

In addition, the "oblique direction" in which irradiation with unpolarized light is performed is not particularly limited as long as it is a direction inclined at a polar angle $\theta$ ($0°<\theta<90°$) with respect to a normal direction of the surface of the coating film. $\theta$ can be appropriately selected according to the purpose, and is preferably 20° to 80°.

The wavelength of the polarized light or the unpolarized light is not particularly limited as long as the light is light to which the photo-alignment group is exposed. Examples thereof include ultraviolet rays, near-ultraviolet rays, and visible rays, and near-ultraviolet rays of 250 to 450 nm are preferable.

In addition, examples of the light source for the irradiation with polarized light or unpolarized light include a xenon lamp, a high-pressure mercury lamp, an extra-high-pressure mercury lamp, and a metal halide lamp. By using an interference filter, a color filter, or the like with respect to ultraviolet rays or visible rays obtained from the light source, the wavelength range of the irradiation can be restricted. In addition, linearly polarized light can be obtained by using a polarization filter or a polarization prism with respect to the light from the light source.

The integrated quantity of the polarized light or the unpolarized light is not particularly limited, and is preferably 1 to 300 mJ/cm$^2$, and more preferably 5 to 100 mJ/cm$^2$.

The illuminance of the polarized light or the unpolarized light is not particularly limited, and is preferably 0.1 to 300 mW/cm$^2$, and more preferably 1 to 100 mW/cm$^2$.

(Step 4)

The step 4 is a step of forming a second optically anisotropic layer on the surface of the first optically anisotropic layer subjected to the photo-alignment treatment by using a second composition containing a second liquid crystal compound having a polymerizable group.

The second liquid crystal compound having a polymerizable group contained in the second composition is as described above.

The second composition may contain a component other than the second liquid crystal compound having a polymerizable group.

Examples of other components which may be contained in the second composition include the polymerization initiator and the solvent described above, which may be contained in the first composition.

The procedure of the above steps is not particularly limited, and a method in which the second composition is applied to the surface of the first optically anisotropic layer subjected to the photo-alignment treatment to align the second liquid crystal compound in the coating film, and the curing treatment is performed can be exemplified.

Examples of the method of applying the second composition include the method of applying the first composition described above.

Examples of the method of aligning the second liquid crystal compound include the method of aligning the first liquid crystal compound described above.

Examples of the method of curing the second liquid crystal compound include the method of curing the first liquid crystal compound described above.

<Polarizing Plate>

A polarizing plate according to the embodiment of the present invention has the above-described optical laminate according to the embodiment of the present invention and a polarizer.

In addition, the polarizing plate according to the embodiment of the present invention can be used as a circularly polarizing plate in a case where the above-described optical laminate according to the embodiment of the present invention is a λ/4 plate.

In a case where the polarizing plate according to the embodiment of the present invention is used as a circularly polarizing plate, the above-described optical laminate according to the embodiment of the present invention serves as a λ/4 plate, and the angle formed between a slow axis of the λ/4 plate and an absorption axis of the polarizer to be described later is preferably 30° to 60°, more preferably 40° to 50°, even more preferably 42° to 48°, and particularly preferably 45°.

Here, the "slow axis" of the λ/4 plate means a direction in which the refractive index is maximum in the plane of the λ/4 plate, and the "absorption axis" of the polarizer means a direction in which the absorbance is highest.

(Polarizer)

The polarizer of the polarizing plate according to the embodiment of the present invention is not particularly limited as long as it is a member having a function of converting light into specific linearly polarized light. An absorption type polarizer or a reflective type polarizer which has been known can be used.

As the absorption type polarizer, an iodine-based polarizer, a dye-based polarizer using a dichroic dye, a polyene-based polarizer, or the like is used. The iodine-based polarizer and the dye-based polarizer include a coating type polarizer and a stretching type polarizer, and any of these is applicable. A polarizer produced by adsorbing iodine or a dichroic dye to polyvinyl alcohol and performing stretching is preferable.

In addition, examples of the method of obtaining a polarizer by performing stretching and dyeing in a state in which a laminate film is obtained by forming a polyvinyl alcohol layer on a base include the methods described in JP5048120B, JP5143918B, JP4691205B, JP4751481B, and JP4751486B. These known technologies concerning a polarizer can also be preferably used.

As the reflective type polarizer, a polarizer obtained by laminating thin films having different birefringences, a wire grid type polarizer, a polarizer obtained by combining a cholesteric liquid crystal having a selective reflection range and a ¼ wavelength plate, or the like is used.

Among these, a polarizer including a polyvinyl alcohol-based resin (a polymer including —CH$_2$—CHOH— as a repeating unit, particularly, at least one selected from the group consisting of polyvinyl alcohol and an ethylene-vinyl alcohol copolymer) is preferable from the viewpoint of more excellent adhesiveness.

The thickness of the polarizer is not particularly limited, and is preferably 3 to 60 μm, more preferably 3 to 30 μm, and even more preferably 3 to 10 μm.

<Image Display Device>

An image display device according to the embodiment of the present invention is an image display device having the optical laminate according to the embodiment of the present invention or the circularly polarizing plate of the present invention.

The display element which is used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, the image display device according to the embodiment of the present invention is preferably a liquid crystal display device using a liquid crystal cell as a display element or an organic EL display device using an organic EL display panel as a display element.

The liquid crystal cell which is used in the liquid crystal display device is preferably a vertical alignment (VA) mode, an optically compensated bend (OCB) mode, an in-plane-switching (IPS) mode, a fringe-field-switching (FFS) mode, or a twisted nematic (TN) mode, but is not limited thereto.

Suitable examples of the organic EL display device as an example of the image display device according to the embodiment of the present invention include a device having an aspect in which it has a polarizer, the optical laminate according to the embodiment of the present invention, and an organic EL display panel in this order from the visible side.

The organic EL display panel is a member in which a light emitting layer or a plurality of organic compound thin films including a light emitting layer is formed between a pair of electrodes of an anode and a cathode. In addition to the light emitting layer, a hole injection layer, a hole transport layer, an electron injection layer, an electron transport layer, a protective layer, and the like may be provided, and each of these layers may have a different function. Various materials can be used to form the respective layers.

EXAMPLES

Hereinafter, the present invention will be more specifically described with examples. Materials, used amounts, ratios, treatment contents, treatment procedures, and the like shown in the following examples are able to be properly changed unless the changes cause deviance from the gist of the present invention. Therefore, the range of the present invention will not be restrictively interpreted by the following examples.

Synthesis Examples (Synthesis of Monomer mB-1)

As shown in the following scheme, 2-hydroxyethyl methacrylate (13.014 g, 100 mmol), toluene (100 g), and dibutylhydroxytoluene (BHT) (10.0 mg) were put into a 200 ml three-neck flask comprising a stirrer, a thermometer, and a reflux condenser, and stirred at room temperature (23° C.). Next, to the obtained solution, 10-camphorsulfonic acid (230.3 mg, 0.1 mmol) was added, and the mixture was stirred at room temperature. Next, to the obtained solution, 2-(perfluorohexyl)ethyl vinyl ether (39.014 g, 100 mmol) was added dropwise for 1.5 hours, and the mixture was further stirred at room temperature for 3 hours. To the obtained solution, ethyl acetate (200 mL) and sodium bicarbonate water (200 mL) were added to perform separation and purification, and an organic phase was extracted. Magnesium sulfate was added to the obtained organic phase. The resulting organic phase was dried and filtered, and then from the obtained filtrate, the solvent was distilled off to obtain 46.8 g of a monomer mB-1 represented by Formula mB-1.

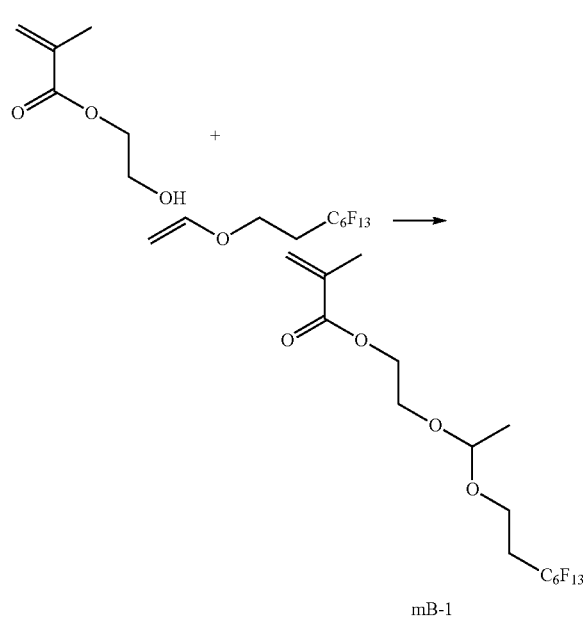

mB-1

(Synthesis of Monomer mB-13)

According to the following scheme, a monomer represented by Formula mB-13 was synthesized.

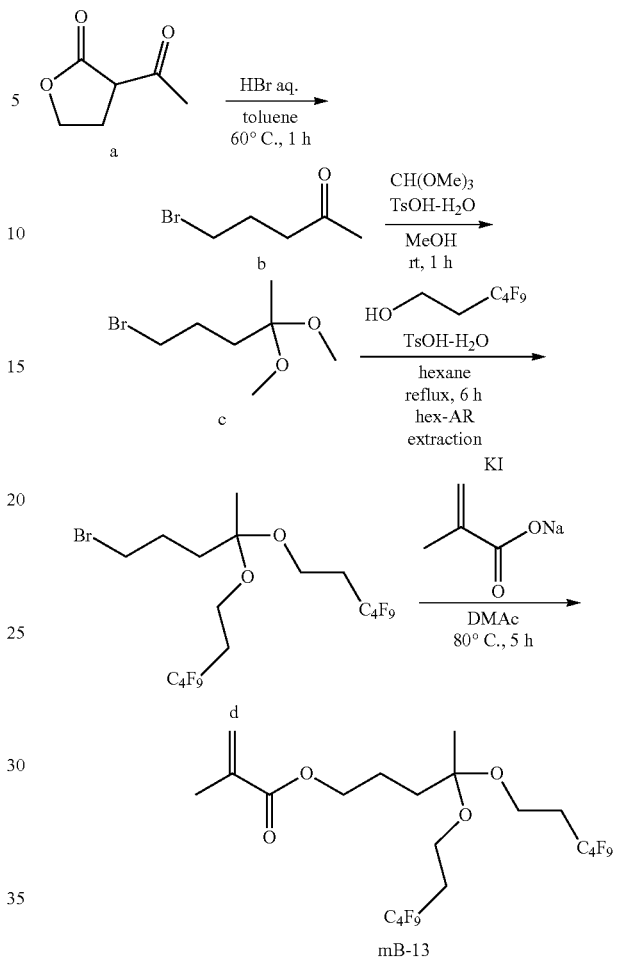

mB-13

<Synthesis of b>

In a 2000 mL eggplant flask, 2-acetylbutyrolactone (a compound represented by Formula a in the above scheme) (200 g), an aqueous hydrogen bromide solution (concentration: 48%) (320 g), and toluene (300 mL) were weighed and stirred for 1 hour at 60° C. The reaction solution was cooled to room temperature and transferred to a separating funnel, and hexane (100 mL) was added thereto. With saturated sodium hydrogen carbonate water (100 mL) containing sodium thiosulfate (10 g) added thereto and saturated saline (100 mL), separation and washing were performed, and the obtained organic phase was dried with anhydrous magnesium sulfate and concentrated to obtain a compound b (a compound represented by Formula b in the above scheme) (260.0 g) as a brown liquid.

<Synthesis of c>

In a 2000 mL eggplant flask, the compound b (256 g), trimethyl formate (165.6 g), p-toluenesulfonic acid monohydrate (9 g), and methanol (400 mL) were weighed and stirred for 1 hour at room temperature. To the obtained reaction solution, diisopropylethylamine (15 mL) was added, and the solvent was distilled off by an evaporator. Hexane (500 mL) and ethyl acetate (50 mL) were added to the obtained residue and transferred to a separating funnel, and separation and washing were performed twice with an aqueous saturated sodium hydrogen carbonate solution (500 mL). The obtained organic phase was dried with anhydrous magnesium sulfate and concentrated to obtain a compound c (a compound represented by Formula c in the above scheme) (248.0 g) as a brown liquid.

<Synthesis of d>

In a 500 mL eggplant flask, the compound c (50 g), p-toluenesulfonic acid monohydrate (0.45 g), 1H,1H,2H, 2H-perfluorohexane-1-ol (172.5 g), and hexane (100 mL) were weighed, and Dean-Stark was mounted at 77° C. The mixture was stirred for 6 hours, and a reaction solution was obtained.

Then, diisopropylethylamine (1 mL) was added to the reaction solution, and the solvent was distilled off by an evaporator to obtain a concentrated solution. The concentrated solution was transferred to a separating funnel, and hexane (700 mL) and acetonitrile (400 mL) were added thereto. Then, the hexane phase was fractionated and concentrated by an evaporator to obtain a compound d (a compound represented by Formula d in the above scheme) (73.0 g) as a brown liquid.

<Synthesis of Monomer mB-13>

In a 300 mL eggplant flask, the compound d (50 g), dibutylhydroxytoluene (50 mg), potassium iodide (1.23 g), sodium methacrylate (12 g), and N,N-dimethylacetamide (50 mL) were weighed and stirred for 5 hours at 80° C. The obtained reaction solution was cooled to room temperature, water (200 mL) was added to the reaction solution, and the mixture was stirred for 5 minutes. The obtained solution was transferred to a separating funnel, and hexane (200 mL) and ethyl acetate (20 mL) were added thereto. The obtained mixed liquid was shaken in the separating funnel, and then the water phase was removed. An aqueous saturated sodium chloride solution was added to the obtained organic phase to perform separation and washing. The obtained organic phase was dried with anhydrous sodium sulfate and concentrated, and column chromatography was performed to obtain a monomer mB-13 (41 g).

(Synthesis of Monomer mC-1c)

Hydroxyethyl methacrylate (100.0 g) and dimethylacetamide (600 mL) were added to a 3 L three-neck flask comprising a stirring blade, a thermometer, a dropping funnel, and a reflux pipe, and then 3-chloropropionic acid chloride (126.6 g) was added dropwise during stirring at 0° C. to cause a reaction for 3 hours at room temperature.

Ethyl acetate (1 L) was added to the reaction solution, and separation and washing were performed sequentially with 1 N hydrochloric acid, saturated aqueous sodium bicarbonate, ion exchange water, and saturated saline. The obtained organic phase was dried with magnesium sulfate. The magnesium sulfate was separated by filtering, and the organic phase was concentrated. Then, by purification with a silica gel column (hexane/ethyl acetate=3/1), 148.8 g of a monomer mC-1c shown below was obtained.

The monomer mC-1c corresponds to a monomer which forms the above-described repeating unit C-1 by a polymer reaction according to the following scheme.

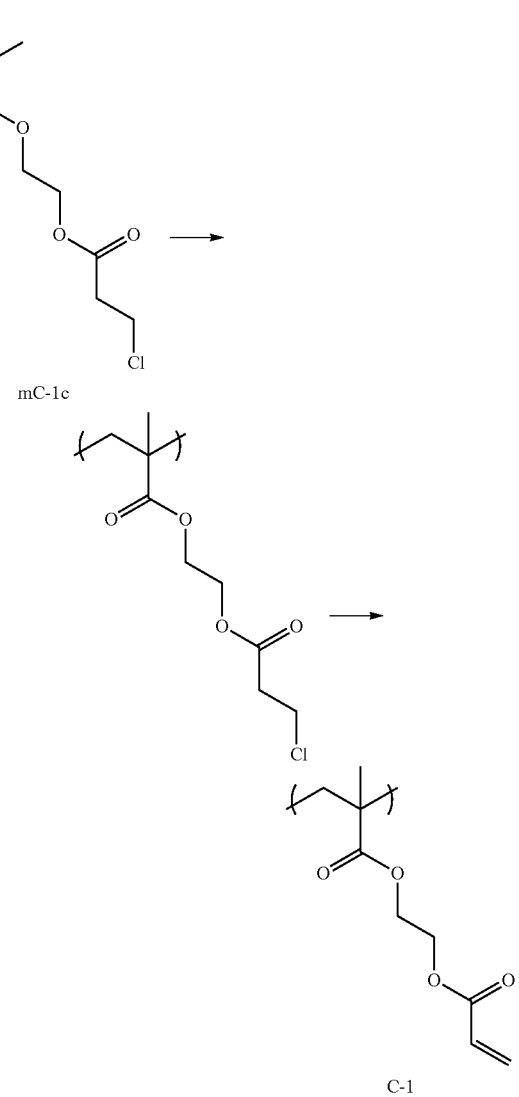

(Synthesis of Monomer mA-9)

4-aminocyclohexanol (50.0 g), triethylamine (48.3 g), and N,N-dimethylacetamide (800 g) were weighed in a 2 L three-neck flask comprising a stirring blade, a thermometer, a dropping funnel, and a reflux pipe, and stirred under ice cooling.

Next, methacrylic acid chloride (47.5 g) was added dropwise using the dropping funnel for 40 minutes, and after completion of the dropwise addition, the mixture was stirred at 40° C. for 2 hours.

The reaction solution was cooled to room temperature (23° C.), and then the precipitated salt was removed by suction filtration. The obtained organic phase was transferred to a 2 L three-neck flask comprising a stirring blade, a thermometer, a dropping funnel, and a reflux pipe, and stirred under water cooling.

Next, N,N-dimethylaminopyridine (10.6 g) and triethylamine (65.9 g) were added, and 4-octyloxy cinnamic acid chloride (191.9 g) dissolved previously in tetrahydrofuran (125 g) was added dropwise using the dropping funnel for 30 minutes. After completion of the dropwise addition, the mixture was stirred at 50° C. for 6 hours. The reaction solution was cooled to room temperature, and then separation and washing were performed with water. The obtained organic phase was dried with anhydrous magnesium sulfate and concentrated, and thus a yellowish white solid was obtained.

The obtained yellowish white solid was dissolved in methyl ethyl ketone (400 g) by heating and recrystallized to obtain 76 g of a monomer mA-9 shown below as a white solid (yield 40%).

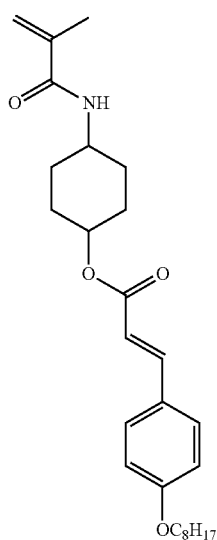

mA-9

Synthesis Example 1

(Synthesis of Photo-Alignment Polymer P-1)

2-butanone (23 parts by mass) as a solvent, the following monomer mA-9 (2.53 parts by mass), the following monomer mC-1c (3.81 parts by mass), the following monomer mB-1 (4.1 parts by mass), and 2,2'-azobis(isobutyronitrile) (0.075 parts by mass) as a polymerization initiator were put into a flask comprising a cooling pipe, a thermometer, and a stirrer, and stirred while maintaining the refluxing state for 7 hours by heating in a water bath with nitrogen flowing into the flask at 15 mL/min. After completion of the reaction, the reaction mixture was allowed to cool to room temperature. The obtained polymer solution was poured into a large excess of methanol to precipitate the polymer, and the recovered precipitate was separated by filtering and washed with a large amount of methanol. Then, the resulting material was dried in a vacuum for 6 hours at 40° C., and thus a copolymer P-1c having the repeating unit A-9, the repeating unit C-1c, and the repeating unit B-1 described above was obtained.

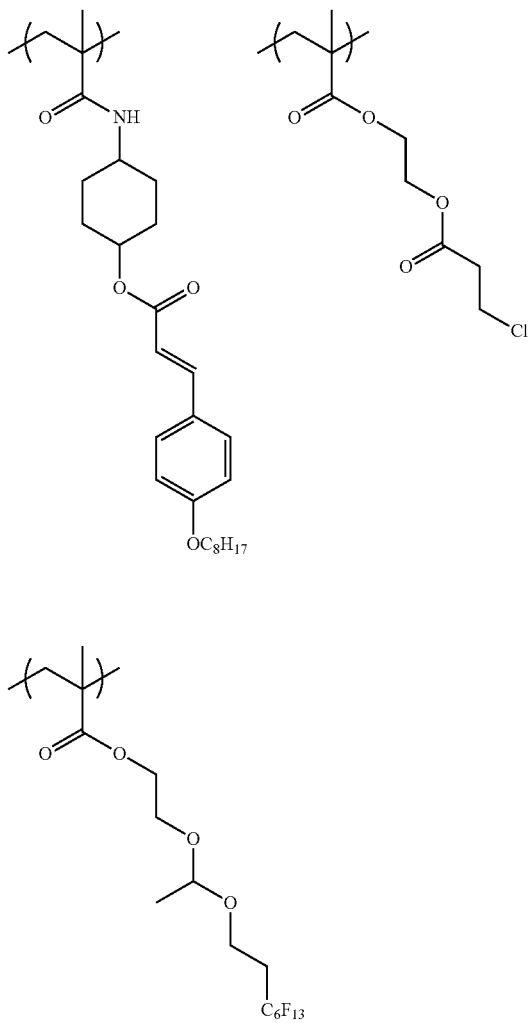

P-1c

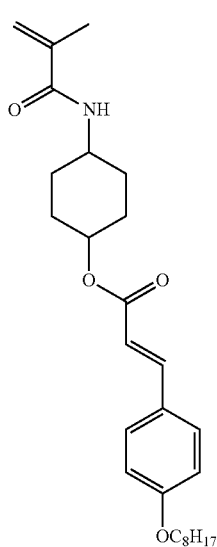

mA-9 mC-1c

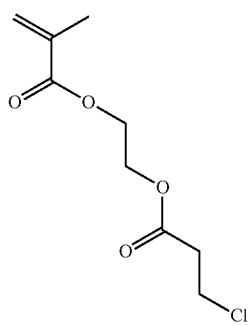

mB-1

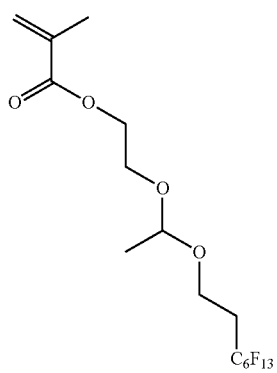

Subsequently, the copolymer P-1c (3.3 parts by mass), 4-methoxyphenol (0.016 parts by mass), triethylamine (3.75 parts by mass), and dimethylacetamide (4.95 parts by mass) were put into a flask comprising a cooling pipe, a thermometer, and a stirrer, and stirred for 4 hours at 60° C. by heating in a water bath. After completion of the reaction, the reaction mixture was allowed to cool to room temperature. The obtained reaction solution was poured into a large excess of methanol/water (1/3) to precipitate the polymer, and the recovered precipitate was separated by filtering and washed with a large amount of methanol/water (1/3). Then, the resulting material was subjected to blast drying for 12 hours at 40° C., and thus a photo-alignment polymer P-1 having the repeating unit A-9, the repeating unit C-1, and the repeating unit B-1 described above at a ratio of 20/55/25 (mol %) was obtained.

P-1

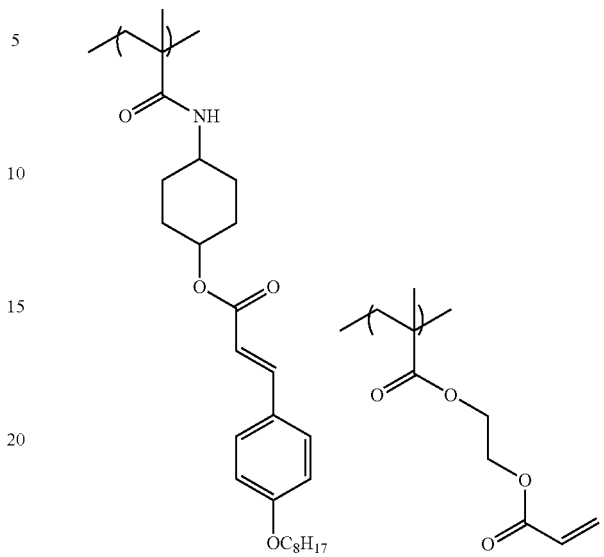

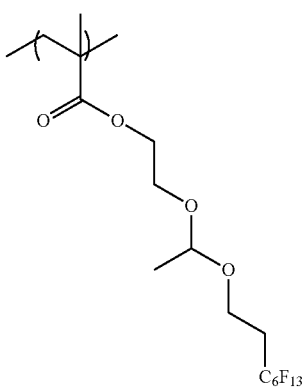

Synthesis Example 2

(Synthesis of Photo-Alignment Polymer P-2)

Toluene (72.9 parts by mass) as a solvent, the following monomer mA-9 (10.20 parts by mass), the following monomer mB-13 (13.86 parts by mass), the following monomer mC-1c (16.60 parts by mass), and 2,2'-azobis(isobutyronitrile) (0.668 parts by mass) as a polymerization initiator were put into a flask comprising a cooling pipe, a thermometer, and a stirrer, and stirred while maintaining the refluxing state for 7 hours by heating in a water bath with nitrogen flowing into the flask at 30 mL/min.

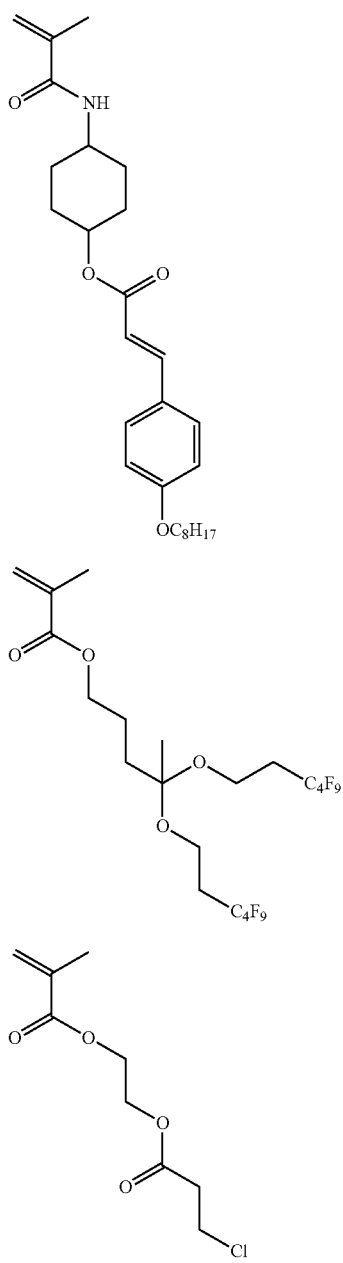

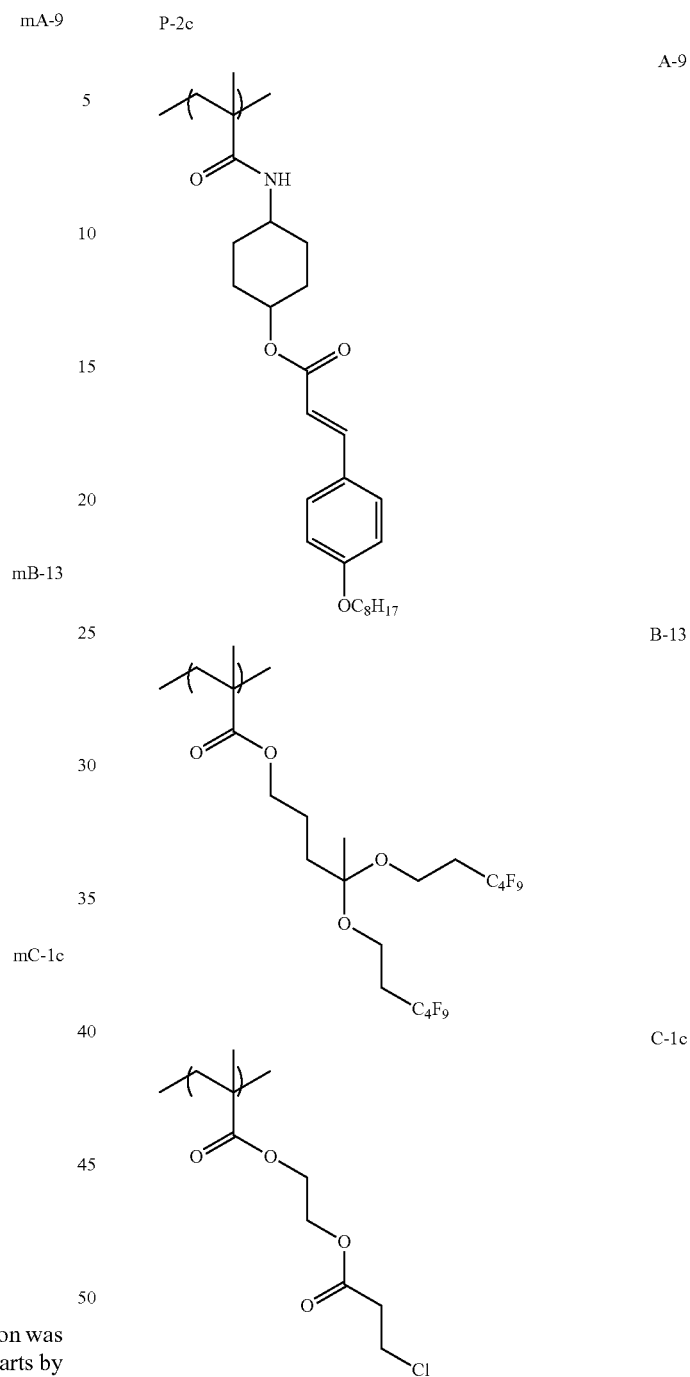

After completion of the reaction, the reaction solution was allowed to cool to room temperature, and acetone (8 parts by mass) was added to the obtained reaction solution to prepare a polymerization solution A. About ⅓ of the amount of the polymerization solution A was poured into heptane (1,200 mL) with an internal temperature of 20° C. for 15 to 20 minutes. The mixture was cooled so that the internal temperature was 0° C. to 5° C., and the remaining polymerization solution A (about ⅔) was added dropwise for 30 to 40 minutes. Furthermore, after stirring for 10 minutes at an internal temperature of 5° C., the precipitated polymer was separated by filtering, washed with heptane (200 mL) cooled to 5° C. or lower, and dried in a vacuum for 6 hours at 40° C., and thus a copolymer P-2c having the repeating unit A-9, the repeating unit B-13, and the repeating unit C-1c described above was obtained.

Subsequently, the copolymer P-2c (3.3 parts by mass), 4-methoxyphenol (0.016 parts by mass), triethylamine (3.75 parts by mass), and dimethylacetamide (4.95 parts by mass) were put into a flask comprising a cooling pipe, a thermometer, and a stirrer, and stirred for 4 hours at 60° C. by heating in a water bath. After completion of the reaction, the reaction mixture was allowed to cool to room temperature. The obtained reaction solution was poured into a large excess of methanol/water (1/3) to precipitate the polymer, and the recovered precipitate was separated by filtering and washed with a large amount of methanol/water (1/3). Then, the resulting material was subjected to blast drying for 12 hours at 40° C., and thus the following photo-alignment polymer P-2 was obtained. The content ratio of the repeating unit A-9, the repeating unit B-13, and the repeating unit C-1 of the photo-alignment polymer P-2 is 25/40/35 (mass %) from the left.

P-2

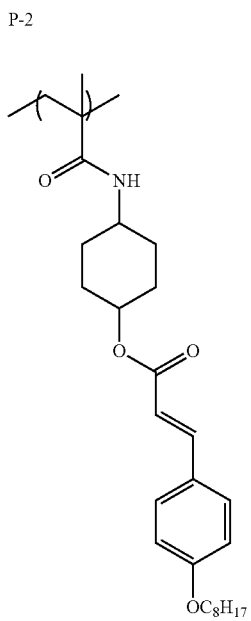
A-9

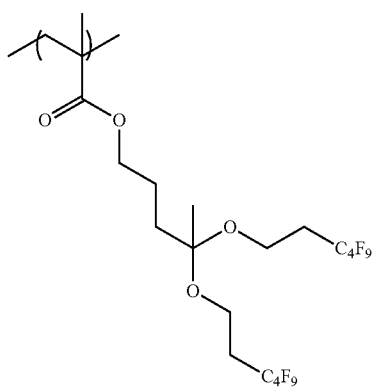
B-13

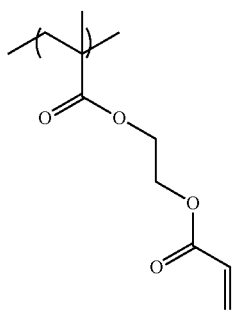
C-1

(Manufacturing of Support)

A cellulose acylate film (TD40UL, manufactured by FUJIFILM Corporation) passed through dielectric heating rolls at a temperature of 60° C., and after the film surface temperature was raised to 40° C., an alkali solution having the following composition was applied to one surface of the film using a bar coater at a coating rate of 14 ml/m², and heated to 110° C.

Next, the obtained film was transported for 10 seconds under a steam-type far-infrared heater manufactured by NORITAKE CO., LIMITED.

Next, using a bar coater, pure water was applied in the same manner to the obtained film at 3 ml/m².

Next, water washing by a fountain coater and dewatering by an air knife were repeatedly performed on the obtained film three times. Then, the film was transported to a drying zone at 70° C. for 10 seconds and dried to produce an alkali-saponified cellulose acylate film, and the film was used as a support.

| Composition of Alkali Solution | |
|---|---|
| Potassium Hydroxide | 4.7 parts by mass |
| Water | 15.8 parts by mass |
| Isopropanol | 63.7 parts by mass |
| Surfactant ($C_{14}H_{29}O(CH_2CH_2O)_{20}H$) | 1.0 part by mass |
| Propylene Glycol | 14.8 parts by mass |

An alignment layer coating liquid having the following composition was continuously applied to an elongated cellulose acetate film saponified as described above by a #14 wire bar coater. After application, the obtained film was dried by hot air at 60° C. for 60 seconds, and further dried by hot air at 100° C. for 120 seconds. In the following composition, "Polymerization Initiator ONO" represents a photopolymerization initiator (IRGACURE 2959, manufactured by BASF SE).

Next, a rubbing treatment was continuously performed on the dried coating film to form an alignment layer. In this case, the longitudinal direction of the elongated film was parallel to the transport direction, and the rotation axis of a rubbing roller was in a clockwise direction of 45° with respect to the longitudinal direction of the film.

| Composition of Alignment Layer Coating Liquid | |
|---|---|
| Following Modified Polyvinyl Alcohol | 10.0 parts by mass |
| Water | 371.0 parts by mass |
| Methanol | 119.0 parts by mass |
| Glutaric Aldehyde | 0.5 parts by mass |
| Polymerization Initiator (IN1) | 0.3 parts by mass |

(In the following structural formulae, the ratio indicates a molar ratio)

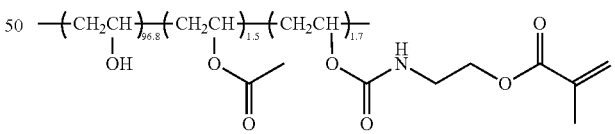

Modified Polyvinyl Alcohol

Example 1

(Formation of First Optically Anisotropic Layer)

The following rod-like liquid crystal compound A (80 parts by mass), the following rod-like liquid crystal compound B (20 parts by mass), a photopolymerization initiator (IRGACURE 819, manufactured by BASF SE) (3.0 parts by mass), the following photo-acid generator (B-1-1) (5.0 parts by mass), the following vertical alignment agent A (1 part by mass), the following vertical alignment agent B (0.5 parts by mass), and the photo-alignment polymer P-1 (3.0 parts by mass) were dissolved in methyl ethyl ketone (215 parts by mass) to prepare a first optically anisotropic layer forming composition 1.

The prepared first optically anisotropic layer forming composition 1 was applied to the alignment layer by a #3.0 wire bar coater, heated for 2 minutes at 70° C., and cooled to 40° C. Then, irradiation with 500 mJ/cm² of ultraviolet rays was performed thereon using a 365 nm UV-LED while nitrogen purge was conducted to make an atmosphere with an oxygen concentration of 1.0 vol % or less. Then, by performing annealing for 1 minute at 120° C., a first optically anisotropic layer was formed. The first optically anisotropic layer was a positive C plate satisfying Expression (C1) nz>nx≈ny, and had a thickness of about 0.4 μm.

Rod-Like Liquid Crystal Compound A

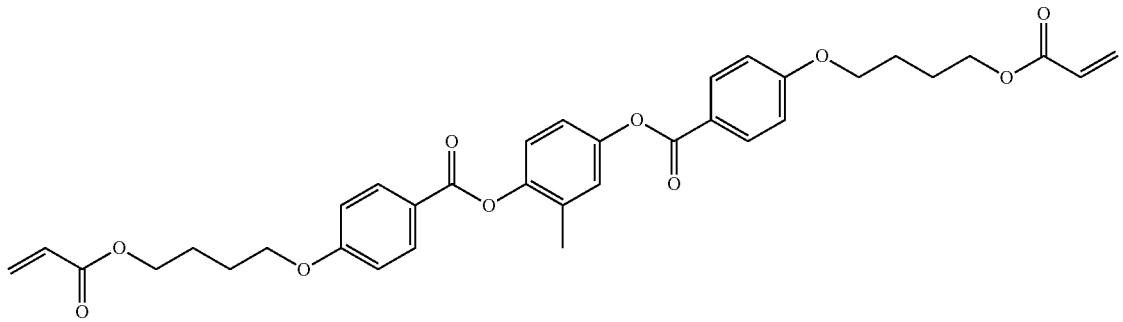

Rod-Like Liquid Crystal Compound B

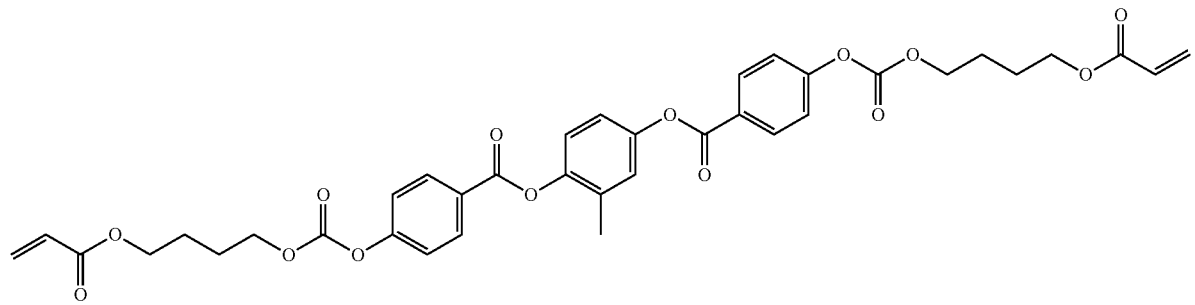

Vertical Alignment Agent A

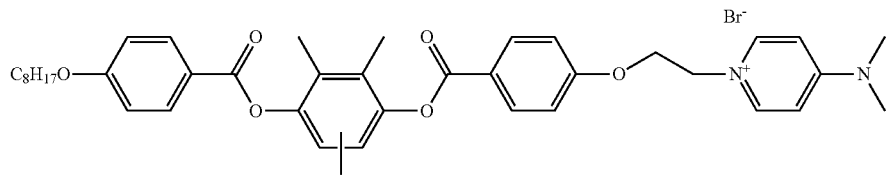

Vertical Alignment Agent B

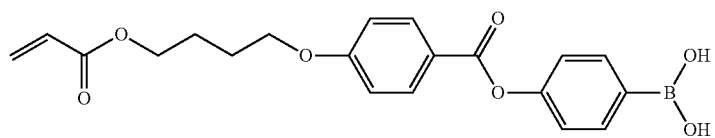

B-1-1

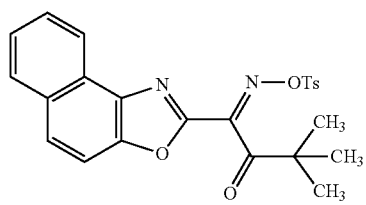

(Irradiation Step (Impartation of Alignment Function))

The obtained first optically anisotropic layer was irradiated with 7.9 mJ/cm² of UV light (ultra-high pressure mercury lamp; UL750; manufactured by HOYA CANDEO OPTRONICS CORPORATION) (wavelength: 313 nm) passing through a wire grid type polarizer at room temperature to impart an alignment function.

(Formation of Second Optically Anisotropic Layer)

The above-described rod-like liquid crystal compound A (80 parts by mass), the above-described rod-like liquid crystal compound B (20 parts by mass), a photopolymerization initiator (IRGACURE 907, manufactured by BASF SE) (3 parts by mass), a sensitizer (KAYACURE DETX, manufactured by Nippon Kayaku Co., Ltd.) (1 part by mass), and the following horizontal alignment agent (0.3 parts by mass) were dissolved in methyl ethyl ketone (193 parts by mass) to prepare a second optically anisotropic layer forming composition 1.

The above-described second optically anisotropic layer forming composition 1 was applied to the first optically anisotropic layer by a wire bar coater #7, and heated for 2 minutes at 60° C., and at the temperature maintained at 60° C., irradiation with 300 mJ/cm² of ultraviolet rays was performed thereon using a 160 W/cm air-cooled metal halide lamp (manufactured by Eye Graphics Co., Ltd.) while nitrogen purge was conducted to make an atmosphere with an oxygen concentration of 1.0 vol % or less. Thus, a second optically anisotropic layer (thickness: 2.5 μm) was formed, and an optical laminate was produced. The second optically anisotropic layer was a positive A plate satisfying Expression (A1) nx>ny≈nz.

Horizontal Alignment Agent

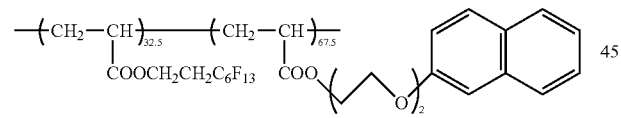

Example 2

An optical laminate was obtained in the same manner as in Example 1, except that as a support, a cellulose acylate film (ZRD40, manufactured by FUJIFILM Corporation) was used instead of the cellulose acylate film with an alignment layer used in Example 1, that as a first optically anisotropic layer forming composition 2, a composition obtained by dissolving the above-described rod-like liquid crystal compound A (83 parts by mass), the following rod-like liquid crystal compound C (15 parts by mass), the following rod-like liquid crystal compound D (2 parts by mass), urethane acrylate (EBECRYL 1290, manufactured by DAICEL-ALLNEX LTD.) (4 parts by mass), a photopolymerization initiator (IRGACURE OXE01, manufactured by BASF SE) (4.0 parts by mass), the following photo-acid generator (B-1-2) (3.0 parts by mass), the following polymer A (2.0 parts by mass), and the photo-alignment polymer P-1 (2.0 parts by mass) in methyl isobutyl ketone (669 parts by mass) was used, and that as a second optically anisotropic layer forming composition 2, the following polymerizable liquid crystal compound A (65 parts by mass) and the following polymerizable liquid crystal compound B (35 parts by mass) were used instead of the above-described rod-like liquid crystal compounds A and B, and the film thickness of the second optically anisotropic layer was changed to 3.0 μm. The first optically anisotropic layer was a positive C plate, and the second optically anisotropic layer was a positive A plate.

Rod-Like Liquid Crystal Compound C

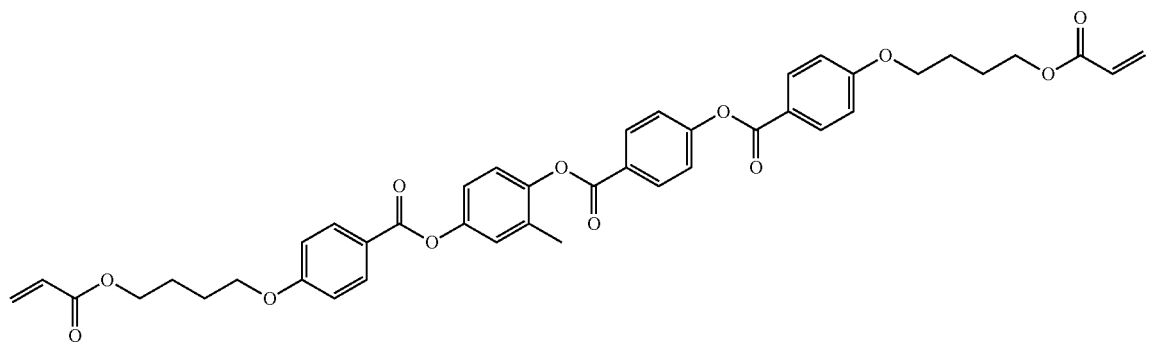

-continued

Rod-Like Liquid Crystal Compound D

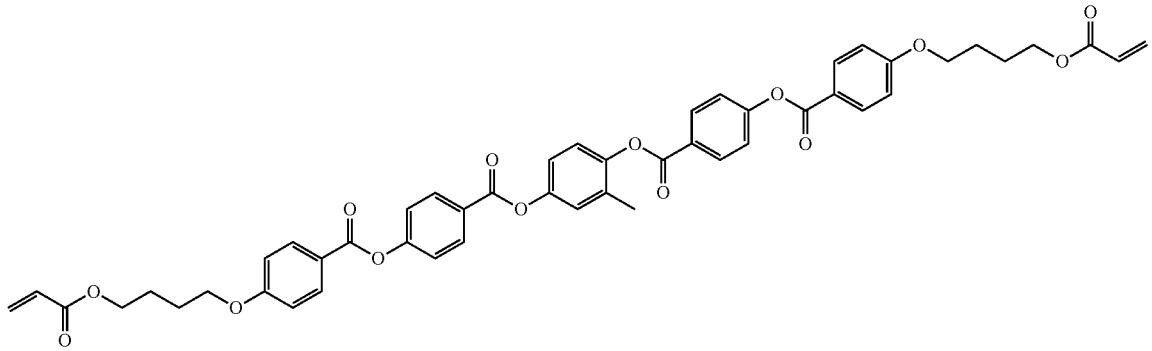

Photo-Acid Generator B-1-2

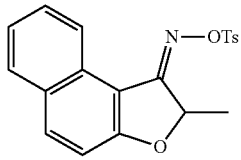

Polymer A

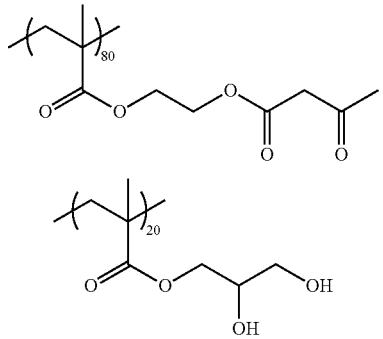

Polymerizable Liquid Crystal Compound A

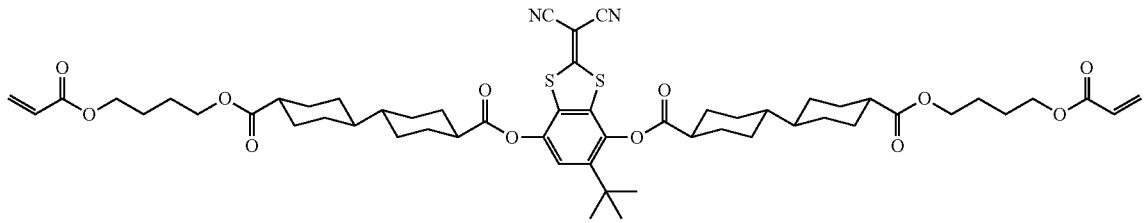

Polymerizable Liquid Crystal Compound B

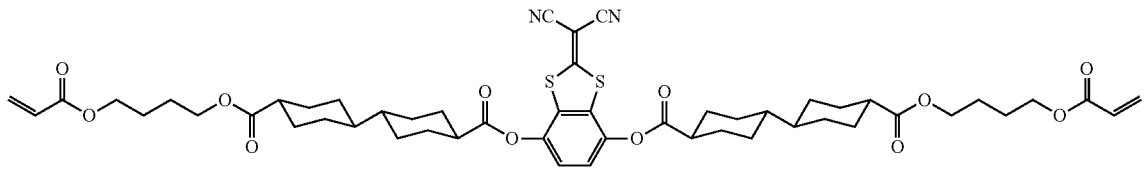

Example 3

(Formation of First Optically Anisotropic Layer)

The above-described rod-like liquid crystal compound A (83 parts by mass), the above-described rod-like liquid crystal compound C (15 parts by mass), the above-described rod-like liquid crystal compound D (2 parts by mass), an acrylate monomer (A-400, manufactured by SHIN-NAKA-MURA CHEMICAL CO., LTD.) (4 parts by mass), the following polymer B (2 parts by mass), the above-described vertical alignment agent A (2 parts by mass), the following photopolymerization initiator B-2 (4 parts by mass), the following photo-acid generator (B-3) (3 parts by mass), and the above-described photo-alignment polymer P-2 (3.0 parts by mass) were dissolved in 680 parts by mass of methyl isobutyl ketone to prepare a first optically anisotropic layer forming composition 3.

The prepared first optically anisotropic layer forming composition 3 was applied to a cellulose-based polymer film (TG40, manufactured by FUJIFILM Corporation) by a #3.0 wire bar coater, heated for 2 minutes at 70° C., and irradiated with 200 mJ/cm² of ultraviolet rays using a 365 nm UV-LED while nitrogen purge was conducted to make an atmosphere with an oxygen concentration of 100 ppm or less. Then, by performing annealing for 1 minute at 120° C., a first optically anisotropic layer was formed.

The first optically anisotropic layer was a positive C plate satisfying Expression (C1) nz>nx≈ny, and had a film thickness of about 0.5 μm.

Polymer B

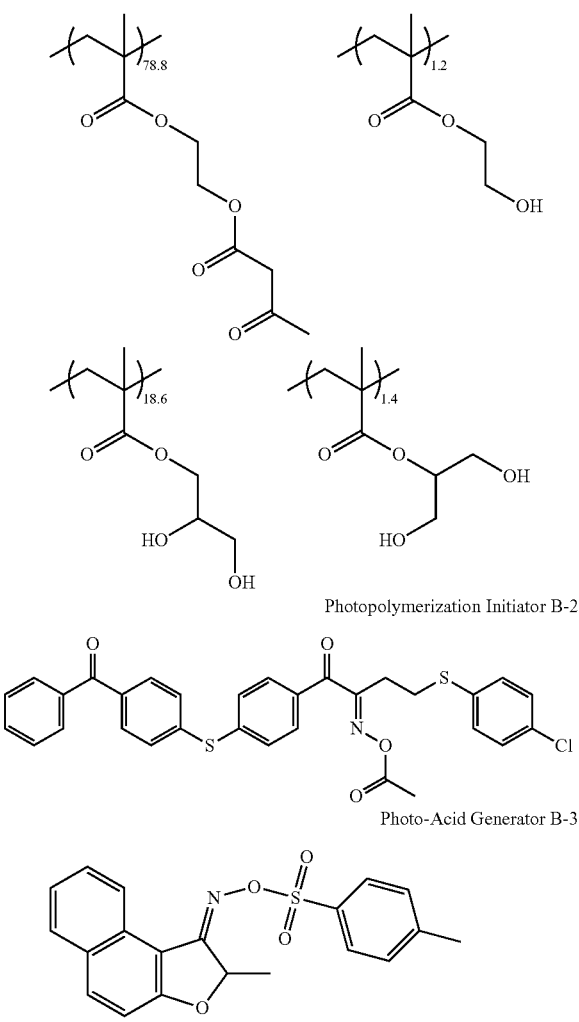

Photopolymerization Initiator B-2

Photo-Acid Generator B-3

(Irradiation Step (Impartation of Alignment Function))

The obtained first optically anisotropic layer was irradiated with 7.9 mJ/cm² of UV light (ultra-high pressure mercury lamp; UL750; manufactured by HOYA CANDEO OPTRONICS CORPORATION) (wavelength: 313 nm) passing through a wire grid type polarizer at room temperature to impart an alignment function.

(Formation of Second Optically Anisotropic Layer (Upper Layer))

A second optically anisotropic layer forming composition 3 was prepared in the same manner as in Example 1, except that instead of the rod-like liquid crystal compound A (80 parts by mass) and the rod-like liquid crystal compound B (20 parts by mass), the above-described polymerizable liquid crystal compound A (65 parts by mass) and the above-described polymerizable liquid crystal compound B (35 parts by mass) were used, and as a solvent, cyclopentanone (246 parts by mass), methyl ethyl ketone (73 parts by mass), and bis(2-(2-methoxyethoxy)ethyl)ether (14 parts by mass) were used.

A second optically anisotropic layer was formed in the same manner as in Example 1, except that the above-described second optically anisotropic layer forming composition 3 was used on the first optically anisotropic layer having the alignment function imparted thereto, and an optical laminate was produced. The second optically anisotropic layer was a positive A plate satisfying Expression (A1) nx>ny≈nz, and had a film thickness of 3.0 μm.

Example 4

An optical laminate was produced in the same manner as in Example 3, except that the second optically anisotropic layer (upper layer) was formed by the following method.

(Formation of Second Optically Anisotropic Layer (Upper Layer))

The above-described rod-like liquid crystal compound A (100 parts by mass), ethylene oxide-modified trimethylolpropane triacrylate (V #360, manufactured by Osaka Organic Chemical Industry Ltd.) (4 parts by mass), a photopolymerization initiator (IRGACURE 819, manufactured by BASF SE). (3 parts by mass), the following left-handed chiral agent (L1) (0.6 parts by mass), and the following leveling agent A (0.08 parts by mass) were dissolved in methyl ethyl ketone (156 parts by mass) to prepare a second optically anisotropic layer forming composition 4.

The second optically anisotropic layer forming composition 4 was applied to the first optically anisotropic layer produced as above using a geeser coating machine, and heated by hot air at 80° C. for 60 seconds. Subsequently, UV irradiation (500 mJ/cm²) was performed thereon at 80° C. to fix the alignment of the liquid crystal compound, and thus a second optically anisotropic layer was formed, which is a layer obtained by fixing the twist-aligned liquid crystal phase.

The thickness of the second optically anisotropic layer was 1.2 μm, And at a wavelength of 550 nm was 164 nm, and the twist angle of the liquid crystal compound was 81°. Assuming that the angle of the width direction of the film is 0° (the angle of the longitudinal direction is 90°), the angle of the alignment axis of the liquid crystal compound when viewed from the surface side of the second optically anisotropic layer was −14° on the air side and was −95° on the side in contact with the first optically anisotropic layer.

Regarding the angle of the alignment axis of the liquid crystal compound contained in the optically anisotropic layer, the substrate is observed from the surface side of the optically anisotropic layer with the width direction of the substrate as a reference of 0°, and the angle is expressed as negative degrees for clockwise (right-handed) and positive degrees for counterclockwise (left-handed).

In addition, regarding the twist angle of the liquid crystal compound, the substrate is observed from the surface side of the optically anisotropic layer, and with the direction of the alignment axis of the liquid crystal compound on the surface side (front side) as a reference, the angle is expressed as negative degrees in a case where the direction of the alignment axis of the liquid crystal compound on the substrate side (back side) is clockwise (right-handed), and as positive degrees in a case where the direction of the alignment axis of the liquid crystal compound on the substrate side is counterclockwise (left-handed).

Left-Handed Chiral Agent (L1)

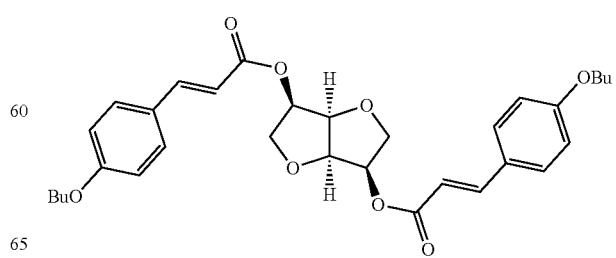

Leveling Agent A (the numerical value in each repeating unit represents the content (mass %) of each repeating unit with respect to all the repeating units. The content of the repeating unit on the left side was 76 mass %, and the content of the repeating unit on the right side was 24 mass %)

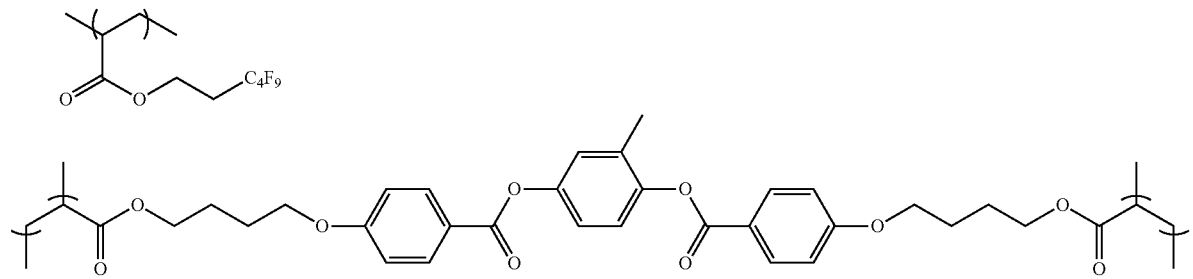

Comparative Example 1

An optical laminate was obtained according to the same procedure as in Example 1, except that the following photo-alignment polymer KH2 described in paragraph 0097 in WO2018/216812A was used instead of the photo-alignment polymer P-1.

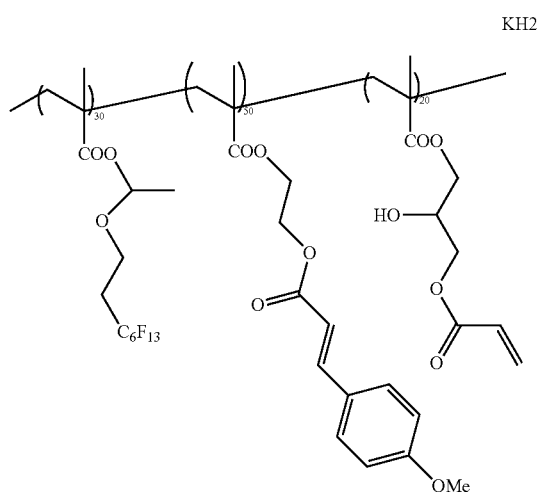

KH2

Comparative Example 2

The laminate described in Example 8 in JP2019-139219A was used as an optical laminate.

<Evaluation>

The following evaluation was performed using the optical laminates obtained in the examples and the comparative examples.

(Liquid Crystal Alignment Properties)

Two polarizing plates were disposed in crossed nicols. The obtained optical laminate was disposed therebetween to observe the degree of light leak and to observe the plane state with a polarization microscope, and evaluation was performed with the following criteria. The results are shown in Table 1.

AA: The liquid crystal director is uniformly adjusted and aligned, and the display performance is excellent.

A: There is no disorder of liquid crystal director, and the plane state is stable.

B: There is partial disorder of liquid crystal director, and the plane state is stable.

C: The liquid crystal director is significantly disordered, the plane state is unstable, and thus the display performance is very poor.

Here, the stable plane state means a state in which defects such as unevenness and alignment failures do not occur in a case where the optical laminate is installed and observed between two polarizing plates in crossed Nicol arrangement. In addition, the liquid crystal director means a vector in a direction (alignment main axis) in which the major axis of liquid crystalline molecules is aligned.

(Adhesiveness)

The produced optical laminate was evaluated for adhesiveness with the following criteria in a crosscut adhesion test (crosscut method) based on JIS K 5400. The results are shown in Table 1.

A: In the crosscut (100 squares) test, the number of remaining squares is 80 or greater and 100 or less.

B: In the crosscut (100 squares) test, the number of remaining squares is 50 or greater and less than 80.

C: In the crosscut (100 squares) test, the number of remaining squares is less than 50.

In addition, the components of the optical laminates of Examples 1 to 4 and Comparative Example 1 in the depth direction were analyzed by a time-of-flight secondary ion mass spectrometer (TOF-SIMS) ("SIMSS" manufactured by IONTOF GmbH) while the film was cut in the depth direction of the optical laminate with an $Ar^+$ cluster gun as described above.

In the optical laminates of Examples 1 and 2, the profile was obtained as shown in FIG. 2. Specifically, a mixed layer corresponding to a region where secondary ions derived from the first liquid crystal compound and secondary ions derived from the second liquid crystal compound were observed was observed, and in the mixed layer, the concentration of the component derived from the first liquid crystal compound gradually decreased from the first optically anisotropic layer toward the second optically anisotropic layer. In addition, in the mixed layer, the concentration of the component derived from the second liquid crystal compound gradually increased from the first optically anisotropic layer to the second optically anisotropic layer.

In the column "Condition 1" in Table 1, a case where the above-described condition 1 is satisfied is represented by "A", and a case where the condition 1 is not satisfied is represented by "B".

In the column "Condition 2", a case where the above-described condition 2 is satisfied is represented by "A", and a case where the condition 2 is not satisfied is represented by "B".

In the column "Requirement 1", a case where secondary ions derived from the first liquid crystal compound and the second liquid crystal compound are detected at any depth position in a region between the first position and the specific depth position (here, second position) described above is represented by "A", and a case where at least a part of secondary ions derived from the first liquid crystal compound and the second liquid crystal compound are not detected is represented by "B".

In Examples 1 and 2, the second distance was 55% of the total of the first distance and the second distance. In Examples 3 and 4, the second distance was 54% of the total of the first distance and the second distance.

TABLE 1

| | Optical Laminate | | | | Evaluation | |
|---|---|---|---|---|---|---|
| | Presence or Absence of Mixed Layer | Thickness of Mixed Layer (nm) | Condition 1 | Condition 2 | Requirement 1 | Liquid Crystal Alignment Properties | Adhesiveness |
| Example 1 | presence | 40 | A | A | A | AA | A |
| Example 2 | presence | 40 | A | A | A | AA | A |
| Example 3 | presence | 40 | A | A | A | AA | A |
| Example 4 | presence | 40 | A | A | A | AA | A |
| Comparative Example 1 | presence | 40 | A | B | A | A | B |
| Comparative Example 2 | absence | — | — | — | — | A | C |

As shown in the above Table 1, the optical laminate according to the embodiment of the present invention had desired effects.

EXPLANATION OF REFERENCES

10: optical laminate
12: first optically anisotropic layer
14: mixed layer
16: second optically anisotropic layer

What is claimed is:

1. An optical laminate comprising:
   a first optically anisotropic layer formed of a first liquid crystal compound;
   a second optically anisotropic layer formed of a second liquid crystal compound; and
   a mixed layer which is disposed between the first optically anisotropic layer and the second optically anisotropic layer and contains a component derived from the first liquid crystal compound and a component derived from the second liquid crystal compound,
   wherein the first optically anisotropic layer is a C plate, the second optically anisotropic layer is an A plate or a layer obtained by fixing a twist-aligned liquid crystal phase,
   the mixed layer further contains a photo-alignment compound, and
   in an analysis of components of the optical laminate in a depth direction by time-of-flight secondary ion mass spectrometry with ion beam irradiation from a surface of the optical laminate on a first optically anisotropic layer side toward a second optically anisotropic layer side, both the following conditions 1 and 2 are satisfied,
   Condition 1: in a case where a depth position of the mixed layer where a secondary ion intensity derived from the photo-alignment compound is maximum is set as a peak position, a depth position closer to the first optically anisotropic layer than the peak position, which exhibits a secondary ion intensity that is half of the secondary ion intensity at the peak position, is set as a first position, and a depth position closer to the second optically anisotropic layer than the peak position, which exhibits a secondary ion intensity that is half of the secondary ion intensity at the peak position, is set as a second position, secondary ions derived from the first liquid crystal compound and the second liquid crystal compound are detected at any depth position in a region between the first position and the second position, and
   Condition 2: in a case where a distance between the first position and the peak position is set as a first distance and a distance between the second position and the peak position is set as a second distance, the second distance is 50% or greater of a total of the first distance and the second distance.

2. The optical laminate according to claim 1,
   wherein in a case where an intermediate position between the first position and the second position is set as a third position, and
   a depth position closer to the second position than the third position, which is between the first position and the second position, is set as a specific depth position,
   secondary ions derived from the first liquid crystal compound and the second liquid crystal compound are detected at any depth position in a region between the first position and the specific depth position.

3. The optical laminate according to claim 1,
   wherein the mixed layer has a thickness of 1 to 1,000 nm.

4. The optical laminate according to claim 3, wherein the mixed layer has a thickness of 10 to 500 nm.

5. The optical laminate according to claim 1, wherein the photo-alignment compound in the mixed layer has a horizontal alignment function.

6. The optical laminate according to claim 1, wherein the first liquid crystal compound and the second liquid crystal compound are liquid crystal compounds having a polymerizable group.

7. A polarizing plate comprising:
the optical laminate according to claim 1; and
a polarizer.

8. An image display device comprising:
the polarizing plate according to claim 7.

9. An image display device comprising:
the optical laminate according to claim 1.

* * * * *